United States Patent
Hayashi et al.

(10) Patent No.: US 9,303,115 B2
(45) Date of Patent: Apr. 5, 2016

(54) THERMOSETTING EPOXY RESIN COMPOSITION AND SEMICONDUCTOR DEVICE

(75) Inventors: Masaki Hayashi, Anan (JP); Yusuke Taguchi, Annaka (JP); Kazutoshi Tomiyoshi, Annaka (JP); Tomoyoshi Tada, Annaka (JP)

(73) Assignee: NICHIA CORPORATION, Anan-shi, Tokushima (JP)

( * ) Notice: Subject to any disclaimer, the term of this patent is extended or adjusted under 35 U.S.C. 154(b) by 694 days.

(21) Appl. No.: 12/637,359

(22) Filed: Dec. 14, 2009

(65) Prior Publication Data

US 2010/0148380 A1 Jun. 17, 2010

(30) Foreign Application Priority Data

Dec. 15, 2008 (JP) .................................. 2008-318429

(51) Int. Cl.
*C08K 5/10* (2006.01)
*C08L 63/00* (2006.01)
(Continued)

(52) U.S. Cl.
CPC .......... *C08G 59/3245* (2013.01); *C08G 59/186* (2013.01); *C08G 59/42* (2013.01);
(Continued)

(58) Field of Classification Search
USPC ........................................................ 523/400
See application file for complete search history.

(56) References Cited

U.S. PATENT DOCUMENTS 6,905,768 B2 * 6/2005 Tada et al. ..................... 428/413
7,527,991 B2 5/2009 Sato et al.
(Continued)

FOREIGN PATENT DOCUMENTS

CN 1522281 A 8/2004
GB 1 362 455 8/1974
(Continued)

OTHER PUBLICATIONS

Advanced technology relating to resin for white light LED and LED package, Electronic Packaging Technology, Apr. 2004, vol. 20, No. 4.
(Continued)

*Primary Examiner* — David Karst
(74) *Attorney, Agent, or Firm* — Birch, Stewart, Kolasch & Birch, LLP

(57) ABSTRACT

A thermosetting epoxy resin composition comprising (A) a reaction mixture of a triazine derivative epoxy resin and an acid anhydride at a ratio of the epoxy group equivalent to the acid anhydride equivalent of 0.6 to 2.0; (B) an internal mold release agent; (C) a reflective material; (D) an inorganic filler; and (E) a curing catalyst. The internal mold release agent of component (B) comprises a carboxylate ester represented by:

$$R^{11}\text{—COO—}R^{12} \quad (1)$$

wherein $R^{11}$ and $R^{12}$ are $C_nH_{2n+1}$ and n is 1 to 30 and a compound represented by:

$$\begin{array}{l} CH_2\text{—}R^1 \\ | \\ CH\text{—}R^2 \\ | \\ CH_2\text{—}R^3 \end{array} \quad (2)$$

wherein $R^1$, $R^2$, and $R^3$ are selected from H, —OH, —OR, and —OCOC$_a$H$_b$ with the proviso that at least one includes —OCOC$_a$H$_b$; R is $C_nH_{2n+1}$ (wherein n is an integer of 1 to 30), a is 10 to 30, and b is 17 to 61.

15 Claims, 8 Drawing Sheets

(51) Int. Cl.
*C08G 59/32* (2006.01)
*C08G 59/18* (2006.01)
*C08G 59/42* (2006.01)
*C08L 63/06* (2006.01)
*H01L 23/29* (2006.01)
*H01L 23/00* (2006.01)
*H01L 23/24* (2006.01)

(52) U.S. Cl.
CPC ............... *C08L 63/00* (2013.01); *C08L 63/06* (2013.01); *H01L 23/293* (2013.01); *H01L 24/97* (2013.01); *H01L 23/24* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *H01L 2224/97* (2013.01); *H01L 2924/01322* (2013.01); *H01L 2924/12042* (2013.01); *H01L 2924/181* (2013.01)

(56) References Cited

U.S. PATENT DOCUMENTS

| | | | |
|---|---|---|---|
| 7,622,516 B1 * | 11/2009 | Starkey | 523/458 |
| 2005/0227393 A1 * | 10/2005 | Sato et al. | 438/25 |
| 2007/0158623 A1 * | 7/2007 | Sawaguchi et al. | 252/582 |
| 2008/0187762 A1 | 8/2008 | Hayashi et al. | |
| 2008/0255283 A1 | 10/2008 | Aoki et al. | |
| 2009/0326100 A1 | 12/2009 | Hamada et al. | |

FOREIGN PATENT DOCUMENTS

| | | |
|---|---|---|
| JP | 2656336 B2 | 9/1997 |
| JP | 2000-196151 A | 7/2000 |
| JP | 2001-234032 A | 8/2001 |
| JP | 2002-226677 | 8/2002 |
| JP | 2002-302533 A | 10/2002 |
| JP | 2003-224305 A | 8/2003 |
| JP | 3512732 B2 | 3/2004 |
| JP | 2005-239912 | 9/2005 |
| JP | 2005-306952 A | 11/2005 |
| JP | 2008-189827 A | 8/2008 |
| JP | 2008-189833 A | 8/2008 |
| JP | 2009-24185 A | 2/2009 |
| SU | 663315 | 5/1979 |
| TW | 200831597 A | 8/2008 |
| WO | WO-2007/015427 A1 | 2/2007 |

OTHER PUBLICATIONS

Encyclopedia Polymerov, vol. 2, Moscow, Sovetskaya Encyclopedia, 1974, pp. 343-350.
Russian Office Action issued in Russian Patent Application No. 2009146439/05(066229) on Dec. 16, 2013.
Taiwanese Office Action dated Feb. 27, 2014 issued in Taiwanese Patent Application No. 098141721, with partial English translation.

* cited by examiner

THERMOSETTING EPOXY RESIN COMPOSITION AND SEMICONDUCTOR DEVICE

CROSS-REFERENCE TO RELATED APPLICATION

This non-provisional application claims priority under 35 U.S.C. §119(a) on Patent Application No. 2008-318429 filed in Japan on Dec. 15, 2008, the entire contents of which are hereby incorporated by reference.

BACKGROUND OF THE INVENTION

This invention relates to a thermosetting epoxy resin composition having excellent mold release properties, flowability, and reliability in high temperature storage, which exhibits, once cured, high light resistance with reduced thermal discoloration, and in particular, reduced yellowing as well as high reliability. This invention also relates to a semiconductor device having a light-emitting element, light-receiving element, or other semiconductor element encapsulated with the cured product of such thermosetting epoxy resin composition.

With the decrease in the thickness and size as well as increase in the power of the semiconductor and electronic devices, severer requirements are imposed on the reliability of the materials used for encapsulating the semiconductor and electronic devices. For example, LED, LD (laser diode), and other semiconductor devices are used for various indicators and light sources because of their small size, brilliant light color, no burning out (due to the nature of the semiconductor device), superior operational properties, and resistance to repeated on/off operations.

Polyphthalamide (PPA) resins are widely used as a material for photocouplers and other semiconductor and electronic devices employing semiconductor elements.

However, with the dramatic progress in the optical semiconductor technology, optical semiconductor devices now use higher power and shorter wavelength, and encapsulation materials and cases currently used for the photocouplers and other optical semiconductor devices which are capable of emitting or receiving a high energy beam are no longer sufficient. More specifically, the encapsulation materials and cases for the semiconductor element using a conventional PPA resin as a non-colored or white material are likely to suffer from problems such as significant deterioration in the prolonged use, uneven discoloration, peeling, and decrease in the mechanical strength, and there is a demand for efficiently solving such problems.

More specifically, Japanese Patent No. 2656336 discloses an optical semiconductor device wherein the encapsulation is accomplished by curing a B-stage optical semiconductor-encapsulating epoxy resin composition comprising an epoxy resin, a curing agent, and a curing accelerator which are uniformly mixed at the molecular level. In this case, the epoxy resin mainly comprises a bisphenol A epoxy resin or a bisphenol F epoxy resin, and use of triglycidyl isocyanate is also mentioned. The triglycidyl isocyanate, however, is used in its Examples by adding a small amount to a bisphenol epoxy resin, and in the investigation by the present inventors, the B stage semiconductor encapsulating epoxy resin composition suffers from the problem of yellowing in long term storage at a high temperature.

Use of a triazine derivative epoxy resin in the epoxy resin composition for encapsulating a light-emitting element is mentioned in JP-A 2000-196151, JP-A 2003-224305, and JP-A 2005-306952. These publications, however, are not the cases where a B-stage epoxy resin is prepared by using triazine derivative epoxy resin with an acid anhydride.

Known publications which may be relevant with the present invention include those as mentioned above, and also, Japanese Patent No. 3512732, JP-A 2001-234032 and JP-A 2002-302533, and Electronics Packaging Technology, April 2004.

SUMMARY OF THE INVENTION

The present invention has been completed in view of the situation as described above, and an object of the present invention is to provide a thermosetting epoxy resin composition which provides a cured product which is homogeneous and maintains whiteness, heat resistance, and light resistance for a long time with reduced yellowing. Another object of the present invention is to provide a semiconductor device comprising a semiconductor element encapsulated with a cured product of the thermosetting epoxy resin composition.

In order to realize the objects as described above, the inventors of the present invention made an intensive study and completed the present invention, and the present invention first provides a thermosetting epoxy resin composition comprising (A) a reaction mixture of a triazine derivative epoxy resin and an acid anhydride at a ratio of the epoxy group equivalent to the acid anhydride equivalent of 0.6 to 2.0, (B) an internal mold release agent, (C) a reflective material, (D) an inorganic filler, and (E) a curing catalyst as essential components, wherein the internal mold release agent of component (B) comprises in combination a carboxylate ester represented by the following general formula (1):

$$R^{11}-COO-R^{12} \quad (1)$$

wherein $R^{11}$ and $R^{12}$ are independently an alkyl group represented by $C_nH_{2n+1}$, and n is a number of 1 to 30 and a compound represented by the following general formula (2):

$$\begin{array}{l} CH_2-R^1 \\ | \\ CH-R^2 \\ | \\ CH_2-R^3 \end{array} \quad (2)$$

wherein $R^1$, $R^2$, and $R^3$ are independently selected from H, —OH, —OR, and —OCOC$_a$H$_b$ with the proviso that at least one of the $R^1$, $R^2$, and $R^3$ includes —OCOC$_a$H$_b$; R is an alkyl group represented by $C_nH_{2n+1}$ (wherein n is an integer of 1 to 30), a is an integer of 10 to 30, and b is an integer of 17 to 61.

The first thermosetting epoxy resin composition provides a cured product which is homogeneous and maintains whiteness, heat resistance, and light resistance for a long time with reduced yellowing. The first thermosetting epoxy resin composition also exhibits excellent molding properties and mold release properties.

Preferably, the total content of the carboxylate ester of formula (1) and the compound of the formula (2) of component (B) in the entire composition is 0.2 to 5.0% by weight, and the weight ratio of the carboxylate ester of the formula (1) to the compound of the formula (2) is in the range of 1:5 to 10:1.

The present invention secondly provides a thermosetting epoxy resin composition comprising (A) a reaction mixture of a triazine derivative epoxy resin and an acid anhydride at a ratio of the epoxy group to the acid anhydride group of 0.6 to 2.0,
(F) a reinforcing material,
(B) an internal mold release agent,
(C) a reflective material,
(D) an inorganic filler, and
(E) a curing catalyst
as essential components, wherein the component (F) is a triclinic silicate mineral represented by the chemical formula: $CaSiO_3$.

The second thermosetting epoxy resin composition provides a cured product which is homogeneous and maintains whiteness, heat resistance, and light resistance for a long time with reduced yellowing, and in particular, a cured product which exhibits excellent mechanical strength, heat resistance, and light resistance.

Preferably, the content of the reinforcing material of component (F) is 1 to 80% by weight in the entire composition, and the internal mold release agent of component (B) contains glycerin monostearate having a melting point of 50 to 70° C. and the content of the internal mold release agent is 0.2 to 5.0% by weight in the entire composition.

The thermosetting epoxy resin composition of the present invention is adapted for use in forming a semiconductor element case.

The present invention also provides a semiconductor device comprising a semiconductor element encapsulated by a cured product of the above thermosetting epoxy resin composition.

The first thermosetting epoxy resin composition of the present invention exhibits excellent flowability, reflow resistance, reliability during high temperature storage, and mold release property, and provides a cured product which is homogeneous and maintains whiteness, heat resistance, and light resistance for a long time with reduced yellowing. The second thermosetting epoxy resin composition of the present invention excellent flowability, reflow resistance, reliability during high temperature storage, and mold release property, and provides a cured product which is having excellent mechanical strength.

Accordingly, the semiconductor device or the electronic device having a light emitting element or a light receiving element such as a photocoupler encapsulated with the cured product of the composition of the present invention is particularly useful in the industry.

BRIEF DESCRIPTION OF THE DRAWINGS

FIG. 11 shows the production method of the surface mount light emitting device.

Figure 1:
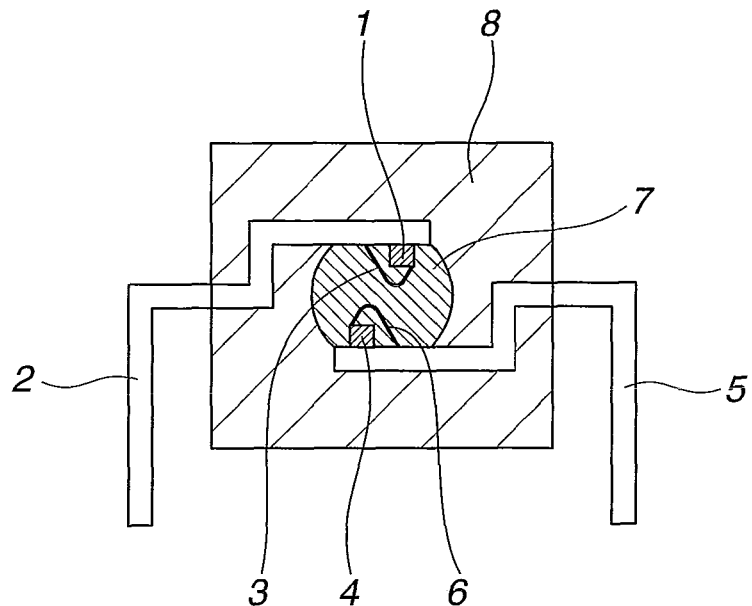
FIG. 1 is a view showing an embodiment of the photocoupler produced by using the thermosetting resin composition of the present invention.

DETAILED DESCRIPTION OF THE INVENTION (A) Reaction Mixture

In the first and second thermosetting epoxy resin compositions of the present invention, the resin component used is a reaction mixture of a triazine derivative epoxy resin and an acid anhydride at a ratio of the epoxy group equivalent to the acid anhydride group equivalent of 0.6 to 2.0.

(A-1) Triazine Derivative Epoxy Resin

When the triazine derivative epoxy resin used for the component (A-1) in the present invention is reacted with the acid anhydride at a predetermined ratio and the reaction mixture is used as the resin component of the thermosetting epoxy resin composition, the cured product of the thermosetting epoxy resin composition will enjoy reduced yellowing, and the semiconductor light emitting device will in turn enjoy reduced deterioration even after the prolonged use. The triazine derivative epoxy resin is preferably a 1,3,5-triazine nucleus derivative epoxy resin. An epoxy resin having isocyanurate ring exhibits excellent light resistance and electric insulation, and the epoxy resin may preferably contain 2 or 3 epoxy groups per one isocyanurate ring. Examples of such triazine derivative epoxy resin include tris(2,3-epoxypropyl) isocyanurate, tris(α-methylglycidyl)isocyanurate, and tris(α-methylglycidyl)isocyanurate.

The triazine derivative epoxy resin used in the present invention may preferably have a softening point of 90 to 125° C. In the present invention, the term "triazine derivative epoxy resin" does not include the one having the triazine ring hydrogenated.

(A-2) Acid Anhydride

The acid anhydride used for the component (A-2) in the present invention functions as a curing agent, and for realizing improved light resistance, the acid anhydride is preferably a non-aromatic acid anhydride having no carbon-carbon double bond. Exemplary such acid anhydrides include hexahydrophthalic anhydride, methylhexahydrophthalic anhydride, trialkyltetrahydrophthalic anhydride, and hydrogenated methylnadic anhydride, which may be used alone or in combination of two or more. Among these, the preferred is methylhexahydrophthalic anhydride. These acid anhydride curing agents may be used alone or in combination of two or more.

The acid anhydride curing agent may be added so that 0.6 to 2.0 equivalents, preferably 1.0 to 2.0 equivalents, and more preferably 1.2 to 1.6 equivalents of the epoxy group of the triazine derivative epoxy resin is present per 1 equivalent of the acid anhydride group. When less than 0.6 equivalent of the epoxy group is present per 1 equivalent of the acid anhydride group, curing will be insufficient and this may result in the reduced reliability. When more than 2.0 equivalents of the epoxy group is present per 1 equivalent of the acid anhydride group, surplus curing agent will be left in the cured product, and this may result in the poor moisture resistance of the cured In the present invention, the components (A-1) and (A-2), or the components (A-1) and (A-2) together with the antioxidant as described below are preliminarily reacted at 70 to 120° C., and preferably at 80 to 110° C. for 4 to 20 hours, and preferably for 6 to 15 hours, or alternatively, the components (A-1) and (A-2) together with the curing catalyst as described below, or the components (A-1) and (A-2) together with the antioxidant and the curing catalyst as described below are preliminarily reacted at 30 to 80° C., or preferably at 40 to 60° C. for 10 to 72 hours, and preferably for 36 to 60 hours to produce a solid having a softening point of 50 to 100° C., and preferably 60 to 90° C., and this solid is preferably pulverized before mixing with other components of the composition. When the reaction mixture has a softening point of less than 50° C., the reaction product will not be solid, while the reaction mixture having a softening point in excess of 100° C. is may result in the poor flowability. When the reaction time is insufficient, polymer component will be insufficient and the reaction product will not be solid, while excessive reaction time may results in unduly reduced flowability. In the present invention, the softening point was measured by ring and ball method according to JIS.

Of the reaction mixture of the triazine derivative epoxy resin (the component (A-1)) and the acid anhydride (the component (A-2)), the resulting reaction mixture (solid) is preferably a mixture containing a high molecular weight component having a molecular weight in excess of 1,500, an intermediate molecular weight component having a molecular weight of 300 to 1,500, and a monomer component at a content of 20 to 70% by weight (the high molecular weight component), 10 to 60% by weight (the intermediate molecular weight component), and 10 to 40% by weight (the monomer component) when analyzed by gel permeation chromatography (GPC) with the sample at a concentration of 0.2% and charge amount of 50 μl using a mobile phase of 100% THF and a flow rate of 1.0 ml/min. at a temperature of 40° C. using RI refractometer.

When triglycidyl isocyanate is used for the component (A-1), the reaction mixture contains the reaction product represented by the following formula (3), and in particular, when the acid anhydride of the component (A-2) is methylhexahydrophthalic anhydride, the reaction mixture contains the reaction product represented by the following formula (4):

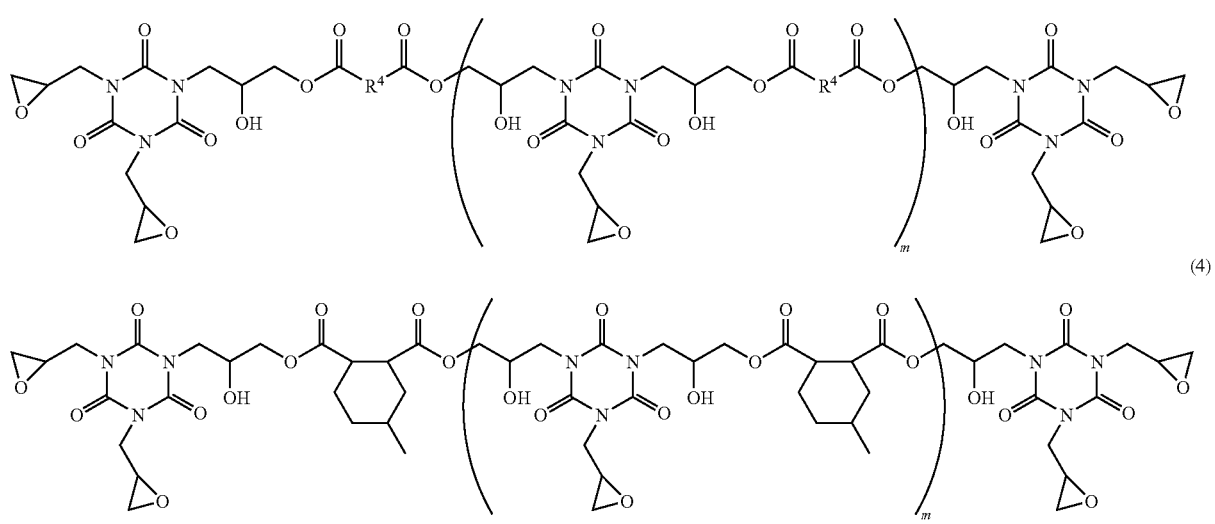

(3)

(4)

wherein $R^4$ is an acid anhydride residue, m is a number of 0 to 200, and preferably 0 to 100 with the average molecular weight of 500 to 100,000. As described above, the reaction mixture of the present invention preferably contains 10 to 60% by weight, and in particular, 10 to 40% by weight of intermediate molecular weight component having a molecular weight of 300 to 1,500, and 10 to 40% by weight, and in particular, 15 to 30% by weight of the monomer component.

(B) Internal Mold Release Agent

The epoxy resin composition of the present invention has an internal mold release agent blended as the component (B), which is blended to improve mold release after the molding.

This internal mold release agent contains a component represented by the following general formula (2):

(2)

wherein $R^1$, $R^2$, and $R^3$ are independently selected from H, —OH, —OR, and —OCOC$_a$H$_b$ with the proviso that at least one of the $R^1$, $R^2$, and $R^3$ includes —OCOC$_a$H$_b$; R is an alkyl group represented by C$_n$C$_{2n+1}$ (wherein n is an integer of 1 to 30), a is an integer of 10 to 30, and b is an integer of 17 to 61, and which has a melting point of 50 to 70° C.

Exemplary internal mold release agents known in the art include natural waxes such as carnauba wax and synthetic waxes such as acid wax, polyethylene wax, and fatty acid ester. Many of these waxes, however, generally experience yellowing and deterioration with lapse of time under high temperature conditions and light irradiation, resulting in the loss of mold release properties.

Among these, the internal mold release agent of the formula (2) according to the present invention exhibits reduced yellowing at high temperature or under irradiation of the light, and retains its excellent mold release properties for a long time.

In the compound of general formula (1), at least one of $R^1$, $R^2$, and $R^3$ should be —OCOC$_a$H$_b$. When all $R^1$, $R^2$, and $R^3$ are —OH, the resulting composition will fail to exhibit sufficient mold release properties and sufficient heat resistance. In contrast, inclusion of the —OCOC$_a$H$_b$ in the structure realizes excellent compatibility, heat resistance, and mold release properties.

With regard to the letters a and b in the —OCOC$_a$H$_b$, the letter a is 10 to 30, and preferably 11 to 20. When the letter a is less than 10, the resulting composition may not enjoy sufficient resistance to yellowing while the letter a in excess of 30 may result in the insufficient compatibility, and hence, in the failure of realizing the excellent mold release effect.

With regard to the letter b, the C$_a$H$_b$ is a saturated or unsaturated aliphatic hydrocarbon group. When C$_a$H$_b$ is an aliphatic unsaturated hydrocarbon group, it may preferably contain 1 or 2 unsaturated groups, and the preferred are those in which the letter b is 2a+1, 2a−1, or 2a−3, and in particular, those in which the letter b is 2a+1 or 2a−1. Accordingly, the letter b is an integer of 17 to 61, preferably 19 to 41, more preferably 21 to 61, and most preferably 23 to 41.

Examples include glycerin monopalmitate, glycerin monostearate, glycerin mono-12-hydroxystearate, glycerin tri-12-hydroxystearate, glycerin monobehenate, propylene glycol monopalmitate, propylene glycol monostearate, and propylene glycol monobehenate.

Melting point and content of the volatile component which volatilizes at a high temperature are also important for the heat resistance properties, and the internal mold release agent may have a melting point of 50 to 90° C., and more preferably 65 to 85° C. as well as a volatile content at 250° C. of up to 10% by weight. When the melting point is less than 50° C., the resistance to yellowing may be insufficient while the melting point in excess of 90° C. may result in the insufficient compatibility, and hence, in the insufficient mold release properties. In view of dispersibility and compatibility, the use of glycerin monostearate having a melting point of 50 to 70° C. is preferable. Also preferred is propylene glycol fatty acid ester.

The internal mold release agent of the formula (2) may preferably constitute 20 to 100% by weight, and 50 to 100% by weight, of the entire internal mold release agent (B). The remaining part of the internal mold release agent (B) may comprise natural wax, acid wax, or other synthetic wax as described above.

In the first epoxy resin composition of the present invention, the internal mold release agent may comprise the compound represented by the general formula (2) in combination with a carboxylate ester represented by the following general formula (1):

$$R^{11}\text{—COO—}R^{12} \quad (1)$$

wherein $R^{11}$ and $R^{12}$ are identical or different an alkyl group represented by C$_n$H$_{2n+1}$, n is a number of 1 to 30, preferably 2 to 28, and more preferably 5 to 25. Use of such mixed system is also recommended in the second epoxy resin composition.

The carboxylate ester of the general formula (1) also contributes for the prevention of the yellowing at high temperature or under light irradiation as well as maintenance of good mold release properties for long time. The carboxylate ester of the general formula (1) and the compound of the formula (2) may be used at a weight ratio of (1):(2) of 1:5 to 10:1, and more preferably 1:4 to 8:1. Use of insufficient carboxylate ester of the general formula (1) may result in the insufficient continuous moldability while excessive use may result in the poor adhesion.

The internal mold release agent (B) is preferably used at an amount of 0.2 to 5.0% by weight, and in particular, at 0.5 to 3.0% by weight of the entire composition. When used at less than 0.2% by weight, the mold release properties may be insufficient, while addition of more than 5.0% by weight may result bleeding and insufficient adhesion.

(C) Reflective Material

The epoxy resin composition of the present invention has a reflective material incorporated. The reflective material of the component (C) is incorporated as a white colorant to improve the whiteness, and use of titanium dioxide for the reflective material is preferred. The titanium dioxide may preferably have a rutile lattice in view of the weatherability. The titanium dioxide is also not limited for its average particle size and shape. However, it may typically have an average particle size of 0.05 to 5.0 μm. The titanium dioxide may be preliminarily surface treated with an inorganic or organic substance in order to improve compatibility and dispersibility with the resin and the inorganic filler, and treatment with Al, Si, or polyol is particularly preferred. For the reflective material, substances other than the titanium dioxide such as potassium titanate, zirconium oxide, zinc sulfide, zinc oxide, and magnesium oxide may also be used as a white colorant either alone or in combination with the titanium dioxide.

When a titanium oxide is used for the component (C) of the present invention, the use of the product having a low lead content is preferable since the use of ingredient with a high lead content may be restricted in view of the environment. The lead content is up to 10 ppm, preferably up to 2 ppm, and more preferably 0 ppm. Non-limiting examples of such product include CR-95 manufactured by Ishihara Sangyo Kaisha, Ltd.

The average particle size can be determined as a weight average diameter D$_{50}$ (or median diameter) through measurement of the particle size distribution by laser diffractometry.

The reflective material may be charged at an amount of 2 to 80% by weight, and in particular, at 5 to 50% by weight of the entire composition. The whiteness may be insufficient when used at an amount less than 2% by weight, while use at an amount in excess of 80% by weight may result in poor moldability including short shot or void formation.

(D) Inorganic Filler

The epoxy resin composition of the present invention further comprises an inorganic filler. The inorganic filler of the component (D) may be the one commonly incorporated in the epoxy resin composition. Exemplary such inorganic fillers include silica such as molten silica and crystalline silica, alumina, silicon nitride, aluminum nitride, boron nitride, glass fiber, and antimony trioxide, and the reflective material (white colorant) as described above are not included in the inorganic filler.

The inorganic filler is not particularly limited for its average particle size or shape. The average particle size, however, is typically 5 to 40 µm.

The average particle size can be determined as a weight average diameter $D_{50}$ (or median diameter) through measurement of the particle size distribution by laser diffractometry.

The inorganic filler used may be the one which has been surface treated by a coupling agent such as a silane coupling agent or a titanate coupling agent to improve binding strength between the resin and the inorganic filler.

Preferable examples of such coupling agent include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane, amino-functional alkoxysilanes such as N-β(aminoethyl)-γ-aminopropyltrimethoxysilane, γ-aminopropyltriethoxysilane, and N-phenyl-γ-aminopropyltrimethoxysilane; and mercapto-functional alkoxysilanes such as γ-mercaptopropyltrimethoxysilane. The coupling agent used for the surface treatment is not limited for its amount of incorporation of the method of the surface treatment.

The inorganic filler may be used at an amount of 20 to 700 parts by weight, and in particular, at 50 to 400 parts by weight in relation to 100 parts by weight the total of the (A-1) epoxy resin and (A-2) acid anhydride. When used at less than 20 parts by weight, strength may not be sufficient, and use in excess of 700 parts by weight may result in the increased viscosity, and hence, in the short shot or loss of the softness, and this may invite defects such as peeling in the element. It is to be noted that the inorganic filler preferably constitute 10 to 90% by weight, and in particular, 20 to 80% by weight of the entire composition.

(E) Curing Catalyst

The curing catalyst of the component (E) is not particularly limited, and the curing catalyst may be any known curing catalyst that is used for the epoxy resin composition. Examples include tertiary amines, imidazoles, their organic carboxylate salts, organic metal carboxylates, metal-organic chelate compounds, aromatic sulfonates, organic phosphine compounds, phosphonium compounds, and other phosphorus curing catalysts as well as salts thereof which may be used alone or in combination of two or more. Among these, the preferred are imidazoles and phosphorus curing catalysts such as 2-ethyl-4-methylimidazole, methyl-tributylphosphonium-dimethylphoshite, and octylate salt of a tertiary amine. Also preferred is a combined use of a quaternary phosphonium bromide and an organic acid salt of amine.

The curing catalyst is preferably used at an amount of 0.05 to 5% by weight, and in particular, at 0.1 to 2% by weight in the entire composition. When used at an amount outside such range, the cured epoxy resin composition may suffer from poor balance between the heat resistance and the moisture resistance.

(F) Reinforcing Material

A reinforcing material is incorporated in the epoxy resin composition of the present invention, and in particular, in the second epoxy resin composition. The reinforcing material of the component (F) is added for the purpose of improving the strength of the molded Article. A preferable example of such reinforcing material is wollastonite which is a triclinic silicate mineral represented by the chemical formula: $CaSiO_3$. Wollastonite includes two types, namely α type and β type wollastonites. The α wollastonite is most often granular, and has a low aspect ratio and a melting point of 1,125° C. β wollastonite is fibrous, and has a high aspect ratio and a melting point of 1,545° C. with excellent reinforcing ability.

The reinforcing material which is typically wollastonite may be added at an amount of 1 to 80% by weight, and in particular, at 5 to 50% by weight of the entire composition. Sufficient strength may not be realized by the addition at an amount less than 1% by weight, while addition in excess of 80% by weight may result in poor moldability including short shot or void formation.

Other Additives

The epoxy resin composition of the present invention may optionally contain an antioxidant.

The antioxidant of the component (G) may be a phenol antioxidant, a phosphorus antioxidant, or a sulfur antioxidant, and examples are as described below.

Exemplary phenol antioxidants include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidene bis(3-methyl-6-t-butylphenol), 3,9-bis[1,1-dimethyl-2-{β-(3-t-butyl-4-hydroxy-5-methyl-phenyl) propionyloxy}ethyl]2,4,8,10-tetraoxaspiro[5,5]undecane, 1,1,3-tris(2-methyl-4-hydroxy-5-t-butylphenyl)butane, and 1,3,5-trimethyl-2,4,6-tris(3,5-di-t-butyl-4-hydroxybenzyl) benzene, and the most preferred is 2,6-di-t-butyl-p-cresol.

Exemplary phosphorus antioxidants include triphenyl phosphite, diphenylalkyl phosphite, phenyldialkyl phosphite, tri(nonylphenyl)phosphite, trilauryl phosphite, trioctadecyl phosphite, triphenyl phosphite, distearyl pentaerythritol diphosphite, tris(2,4-di-tert-butylphenyl)phosphite, diisodecyl pentaerythritol diphosphite, di(2,4-di-tert-butylphenyl) pentaerythritol diphosphite, tristearyl sorbitol triphosphite, and tetrakis(2,4-di-tert-butylphenyl)-4,4'-biphenyl diphosphonate, and the most preferred is triphenyl phosphite.

Exemplary sulfur antioxidants include dilauryl-3,3'-thiodipropionate, dimyristyl-3,3'-thiodipropionate and distearyl-3,3'-thiodipropionate.

Although these antioxidants may be used alone or in combination of two or more, use of a phosphorus antioxidant alone or in combination with a phenol antioxidant and a phosphorus antioxidant is particularly preferred. In this case, the phenol antioxidant and the phosphorus antioxidant may be used at a weight ratio of the phenol antioxidant:the phosphorus antioxidant of 0:100 to 70:30, and in particular, 0:100 to 50:50.

The antioxidant is preferably blended at 0.01 to 10% by weight, and in particular, at 0.03 to 5% by weight in the epoxy resin composition. Insufficient incorporation may result in the insufficient heat resistance which may invite disloroation, while excessive incorporation may result in the inhibition of the curing, and sufficient curability and strength may not be realized.

Various optional additives may be added to the epoxy resin composition of the present invention. For example, a thermoplastic resin or a thermoplastic elastomer for improving the resin properties, a stress reducing agent such as an organic synthetic rubber or an epoxy-based resin, or a halogen trapping agent may be added to the extent not adversely affecting the merits of the present invention.

Other Epoxy Resins

In addition, the composition of the present invention may optionally contain up to certain amount of an epoxy resin other than the component (A-1) to the extent not adversely affecting the present invention, and more specifically at a content of 0 to 40 parts by weight, and in particular, at 5 to 20 parts by weight per 100 parts by weight of the component (A-1). Exemplary such epoxy resins include biphenol epoxy resins such as bisphenol A epoxy resin, bisphenol F epoxy resin, 3,3',5,5'-tetramethyl-4,4'-biphenol epoxy resin, or 4,4'-biphenol epoxy resin, phenol novolak epoxy resin, cresol novolak epoxy resin, bisphenol A novolak epoxy resin, naphthalene diol epoxy resin, trisphenylol methane epoxy resin, tetrakisphenylol ethane epoxy resin, and phenol dicyclopentadiene novolak epoxy resin having its aromatic ring hydrogenated.

The epoxy resin other than the component (A-1) may preferably have a softening point of 70 to 100° C.

Production of the Epoxy Resin Composition

In preparing the epoxy resin composition of the present invention for use in the molding, the components (A-1) and (A-2) are preliminarily mixed and homogeneously kneaded at a temperature in the range of 70 to 120° C., and preferably at 80 to 110° C., or alternatively, the components (A-1), (A-2), and (E) are preliminarily mixed and homogeneously kneaded at a temperature in the range of 30 to 80° C., and preferably at 40 to 60° C. in a reaction vessel which can be heated without using a solvent until the reaction product exhibits an increased viscosity that allows its handling at room temperature, namely, until the softening point reaches 50 to 100° C., and more preferably 60 to 90° C. The reaction product is then cooled for solidification.

As described above, the adequate temperature range used for kneading the components (A-1) and (A-2) is 70 to 120° C., and more preferably, the temperature range is 80 to 110° C. Temperature of less than 70° C. is too low to obtain a reaction mixture which solidifies at room temperature, while use of a temperature in excess of 120° C. results in an excessively high reaction speed, and termination of the reaction at the desired degree of reaction will be difficult. The temperature for kneading the components (A-1), (A-2), and (E) is as described above, and the demerits associated with the use of an excessively low or high temperature are as in the case of the kneading of the components (A-1) and (A-2).

Next, the solidified reaction product is pulverized, and are blended with the components (B), (C), and (D) (and also with the component (E) when the component (E) is not used in the preparation of the solidified reaction product) at a predetermined ratio, and the mixture is thoroughly mixed in a mixer or the like, and then melt kneaded by hot rolls, a kneader, an extruder, or the like. The mixture is then cooled for solidification, and pulverized to an adequate size for use in the molding of the epoxy resin composition.

The thus obtained epoxy resin composition of the present invention can be effectively used in molding a case for a semiconductor device, and this epoxy resin composition is also useful as an encapsulating material for a semiconductor device having a light-emitting element, a light-receiving element, or other semiconductor element therein, for example, as an encapsulating material for a photocoupler. FIG. 1 is a cross sectional view showing an embodiment of a photocoupler which is a typical semiconductor device produced by using the composition of the present invention. In the photocoupler shown in FIG. 1, a semiconductor element 1 comprising a compound semiconductor is die-bonded on a lead frame 2, and further, wire-bonded to another lead frame (not shown) by a bonding wire 3. Facing the semiconductor element 1, a light-receiving semiconductor element 4 is die-bonded on a lead frame 5, and further, wire-bonded to another lead frame (not shown) by a bonding wire 6. The space between these semiconductor elements is filled by a transparent encapsulating resin 7. The semiconductor elements covered by the encapsulating resin 7 are encapsulated by cured product 8 of the thermosetting epoxy resin composition of the present invention.

The method most commonly used in the encapsulation using the thermosetting epoxy resin composition of the present invention is low pressure transfer molding. The epoxy resin composition of the present invention is preferably molded at a temperature of 150 to 185° C. for 30 to 180 seconds. The post-curing may be conducted at 150 to 185° C. for 2 to 20 hours.

First Surface Mount Light Emitting Device

Figure 2:
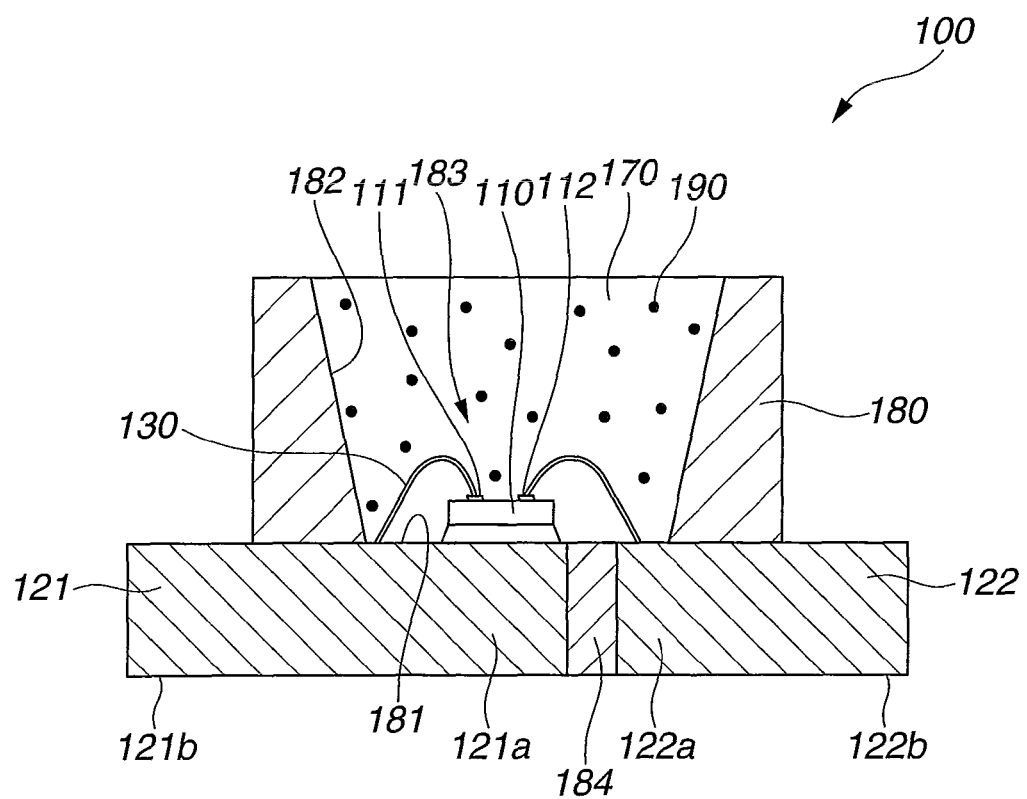
FIG. 2 is a cross sectional view showing one embodiment of the first surface mount light emitting device.

Next, the surface mount light emitting device produced by using the composition of the present invention is described. FIG. 2 is a cross sectional view showing the surface mount light emitting device produced by using the composition of the present invention. The surface mount light emitting device 100 shown in FIG. 2 has a light-emitting element 110, a package 180 having a recess 183 for placing the light-emitting element 110, and an encapsulation member 170 covering the light-emitting element 110. The package 180 is molded from the thermosetting epoxy resin composition of the present invention. A first lead electrode 121 and a second lead electrode 122 which are electrically connected to the light-emitting element 110 are fixedly secured to the package 180.

The light-emitting element 110 has a pair (plus and minus) of a first electrode 111 and a second electrode 112 on the same surface. For the surface mount light emitting device, the one having the pair (plus and minus) of the electrodes on the same surface is described while those having the pair (plus and minus) of the electrodes on opposite surfaces are also applicable. In such a case, the electrode on the lower surface of the light-emitting element is electrically connected to the first lead electrode 121 or the second lead electrode 122 by means of an electro-conductive die bond material without using the wire.

The planer shape of the package 180 on the major surface side is rectangle. However, it may have oblong, circle, pentagon, hexagon, or other shape. Similarly, while the planer shape of the recess 183 on the major surface side is oblong, it may have substantially circular, rectangle, pentagon, hexagon, or other shape. A cathode mark may be provided on the surface of the package 180 to indicate the direction of the cathode of the light-emitting element 110.

The first lead electrode 121 has a first inner lead 121a and a first outer lead 121b, and the first inner lead 121a is electrically connected to the first electrode 111 of the light-emitting element 110 by a wire 130. The first outer lead 121b is exposed from the package 180.

The second lead electrode 122 has a second inner lead 122a and a second outer lead 122b, and the second inner lead 122a is electrically connected to the second electrode 112 of the light-emitting element 110 by the wire 130. The second outer lead 122b is exposed from the package 180.

The surface of the first inner lead 121a and the surface of the second inner lead 122a are exposed from the bottom surface 181 of the recess 183. While the parts of the lead electrodes 121 and 122 that are exposed to the exterior of the package 180 are called the outer leads 121b and 122b, the outer leads 121b and 122b may also be used to refer to the parts exposed on the back side of the package 180. The outer leads 121b and 122b should be the parts which are electrically connected to the exterior electrode. The first lead electrode 121 and the second lead electrode 122 are formed from a metal since they connect with the external electrode. The first lead electrode 121 and the second lead electrode 122 are intervened by a part 184 of the package 180 and short circuit between the electrodes are thereby prevented.

The opening of the recess 183 is larger than its bottom surface 181, and the side surface 182 is tapered toward the bottom. While the recess 183 of the package 180 is preferably surrounded on all sides, it is also acceptable that the recess 183 has walls formed on the opposing two sides.

The encapsulating member 170 is arranged in the recess 183 so that it covers the light-emitting element 110. The encapsulating member 170 is formed from a thermosetting resin, and it contains a fluorescent substance 190 which is homogeneously dispersed in the encapsulating member 170. If desired, the fluorescent substance 190 may comprise a substance having a specific weight higher than that of the encapsulating member 170 so that it sinks toward the side of the bottom surface 181 of the recess 183.

Both the package 180 and the encapsulating member 170 are formed from a thermosetting resin, and since they have similar physical properties including the coefficient of expansion, they have excellent adherence to each other. The arrangement as described above also realizes a surface mount light emitting device having excellent heat resistance and light resistance.

Method for Producing the First Surface Mount Light Emitting Device

Next, the method for producing the light emitting device of the present invention is described.

[1. Formation of Lead Electrodes 121 and 122]

First, Ag film is formed on each surface of the first lead electrode 121 and the second lead electrode 122, for example, by Ag electroplating, electroless Ag plating, PVD, or CVD, and in particular, by Ag electroplating in view of the good balance between the cost and the quality. In the present invention, the term "Ag electroplating" means the method in which electric current is applied to the lead electrode which is used for the cathode in an electroplating solution containing a silver ion to thereby deposit Ag on the surface of the lead electrode (or optionally, the metal of the underlying coating). The Ag electroplating is described in further detail.

First, the lead electrodes 121 and 122 are immersed in an alkaline immersion degreasing solution or an alkaline electrolytic degreasing solution for degreasing. The materials which may be used for the first and the second lead electrode include conductors such as iron, phosphor bronze, and copper alloy. Next, the lead electrodes 121 and 122 are immersed in an acidic solution to remove the oxide film, and if necessary, in an alkaline neutralizing solution for neutralization. Next, the lead electrodes 121 and 122 are preliminarily treated before the Ag plating by Cu strike plating, Cu electroplating, Ag strike plating, or the like, and more specifically, by sequentially immersing the lead electrodes 121 and 122 in the plating solution prepared for each treatment so that each metal electrodeposits on the electrodes. The lead electrodes 121 and 122 after the preliminary treatment is immersed in the electroplating solution for electrodeposition of the Ag. After each electrodeposition, the lead electrodes 121 and 122 are washed with pure water, and the washing with pure water after the Ag plating follows by drying the lead electrodes 121 and 122.

As a consequence of these steps, the surfaces of the lead electrodes 121 and 122 are covered by Ag films 151 and 152.

[2. Sandwiching of the Lead Electrodes 121 and 122 Between the Upper and Lower Molds 141 and 142]

Figure 3:
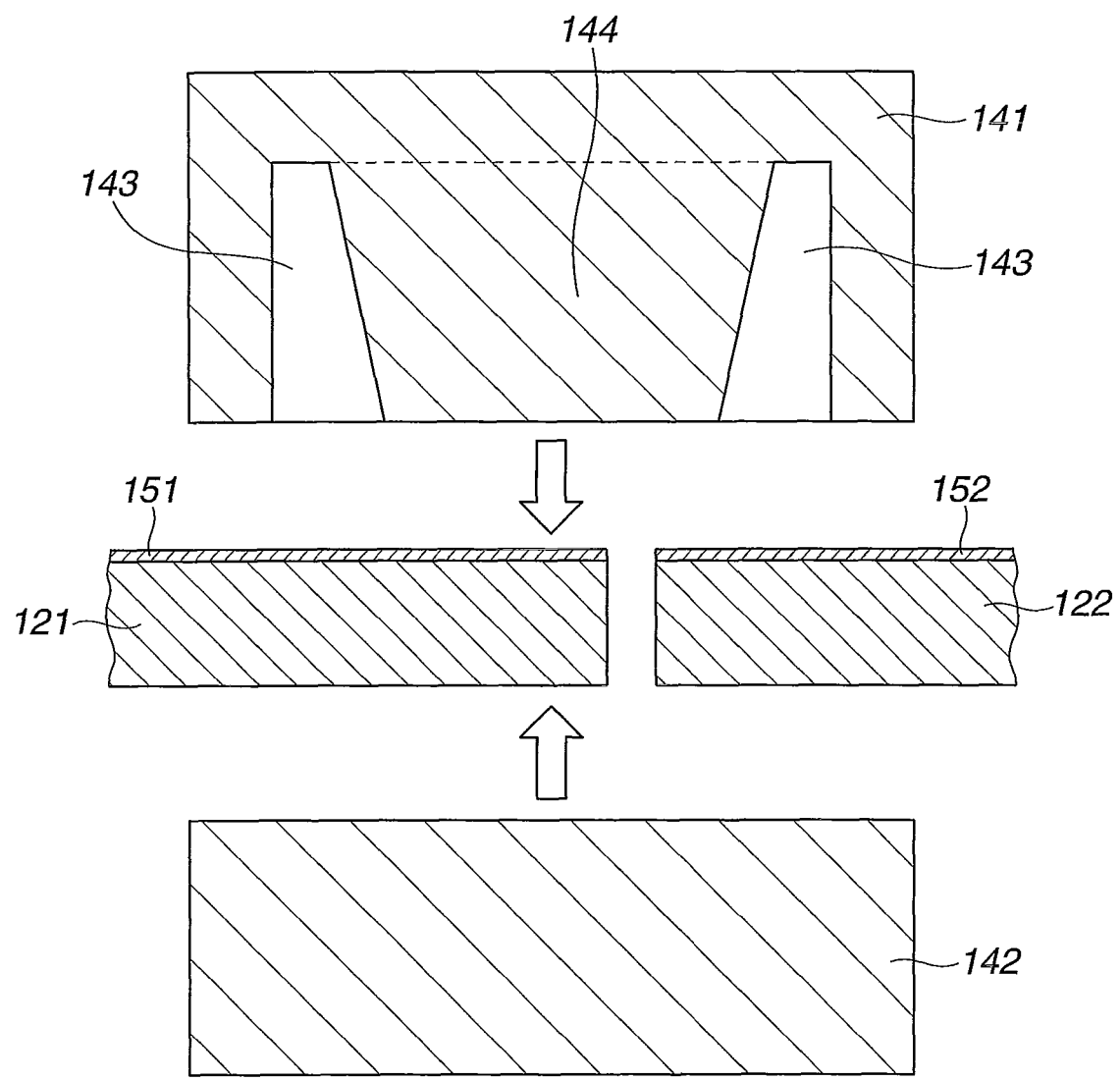
FIG. 3 is a cross sectional view showing the state when the lead electrode is placed between the upper and lower molds in producing the first surface mount light emitting device.
Figure 4:
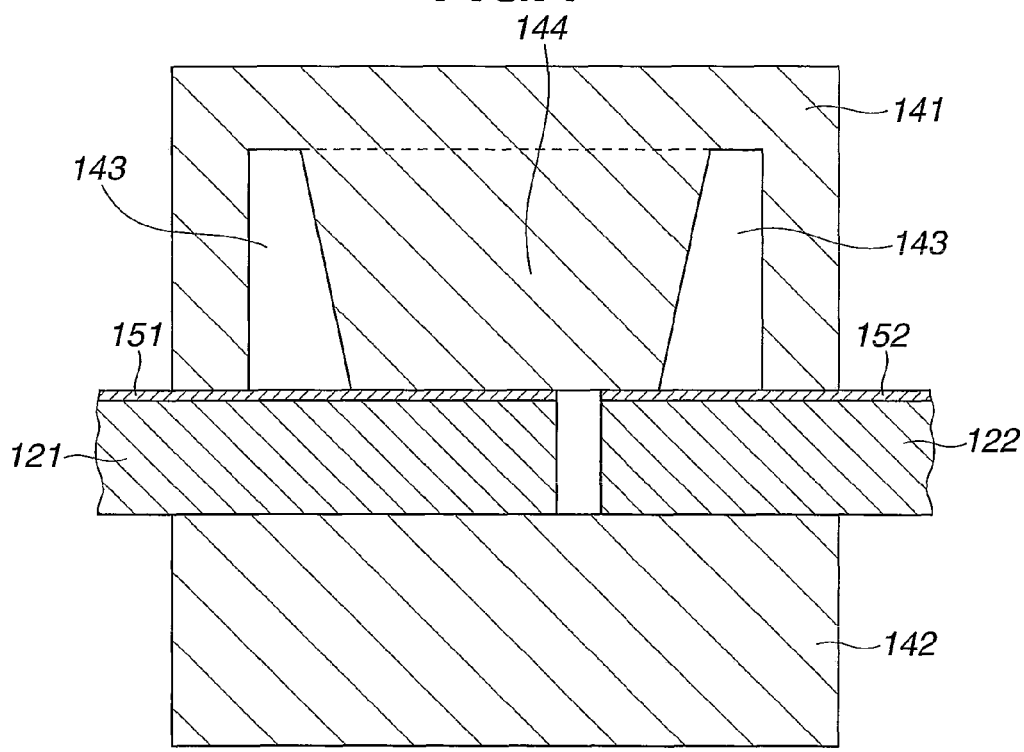
FIG. 4 is a cross sectional view showing the state when the lead electrode is sandwiched between the upper and lower molds in producing the first surface mount light emitting device.

As shown in FIGS. 3 and 4, the first lead electrode 121 and the second lead electrode 122 are placed between the upper mold 141 and the lower mold 142 with the surface covered with the Ag film facing upward. The upper mold 141 has internal cavities 143 corresponding to the shape of the package 180 and a protrusion 144 for forming the recess of the package. The thermosetting resin used for the package 180 has high flowability in the mold, and may intrude into the space between the first and second lead electrodes 121 and 122 and the protrusion 144. When the thermosetting resin adheres on the upper surface of the first lead electrode 121 and the second lead electrode 122, an insulator film will be formed on the surface of the lead electrodes 121 and 122, and therefore, such intrusion of the thermosetting resin is not preferable. Accordingly, the lead electrodes 121 and 122 should be pushed upward from their back surface by the lower mold 142 so that the first lead electrode 121 and the second lead electrode 122 are pushed against the protrusion 144.

In this embodiment, the lower mold has flat surface. The lower mold, however, may also have an internal cavity depending on the type of the package 180. In such a case, it would be difficult to push the lead electrodes 121 and 122 upward by the lower mold 142, and therefore, a protruding member may be formed as a part of the lower mold or a another member extending through the lower mold may be provided to enable the upward pushing of the lead electrodes 121 and 122.

[3. Molding of the Package]

Figure 5:
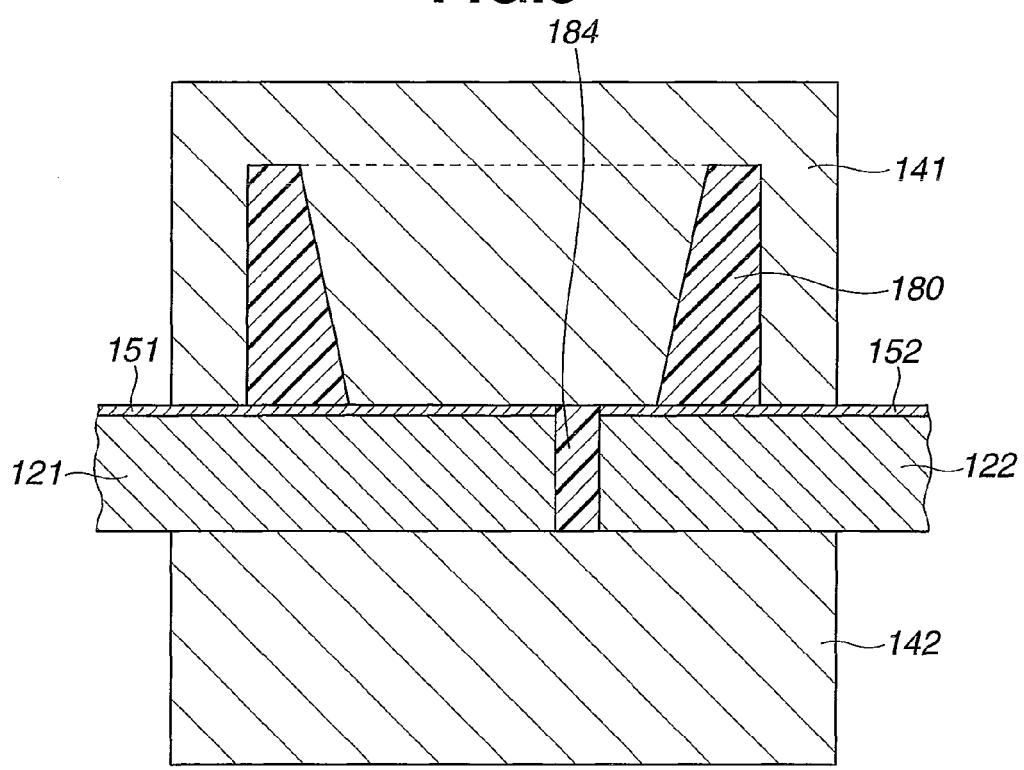
FIG. 5 is a cross sectional view showing the state when the thermosetting resin has been injected in the cavity of the upper mold in producing the first surface mount light emitting device by transfer molding.

As shown in FIG. 5, a thermosetting resin is injected into the cavity 143 in the upper mold 141, and the injected resin is cured by heating to thereby mold the package. Transfer molding may be used for the injection of the thermosetting resin.

In the transfer molding, the thermosetting resin in the form of pellets of predetermined size is placed in the predetermined container, and pressure is applied to the container so that the molten thermosetting resin flows into the cavity between the upper mold 141 and the lower mold 142 which is in communication with the interior of the container. The upper mold 141 and the lower mold 142 is then heated to the predetermined temperature to cure the injected thermosetting resin. These sequential steps are called the transfer molding.

In this case, the first lead electrode 121 and the second lead electrode 122 are firmly sandwiched by the molds, and the lead electrodes are not flapped during the injection of the thermosetting resin, and the burr formation is thereby prevented.

[4. Deburring]

The thus molded package 180 may have burrs on the exterior periphery of the package 180 or in the interior of the recess 183, and the burrs are removed before the mounting of the light-emitting element 10. The burrs may be removed by combined use of the apparatus used for deburring such as electrolysis, chemical dipping, dry blasting, water jet, and hydro-honing.

[5. Formation of Eutectic Layer 160]

The package 180 after the thermosetting is released from the upper mold 141 and the lower mold 142 for mounting of the light-emitting element 110 and the like. Before the mounting of the light-emitting element 110, a eutectic layer 160 comprising metal solder material is deposited on the back surface of the light-emitting element 110. The eutectic layer 160 can be deposited, for example, printing by using a paste, dispensing, transferring, preforming, foil formation, metallization, or ball forming.

[6. Mounting of the Light-Emitting Element 110]

Figure 6:
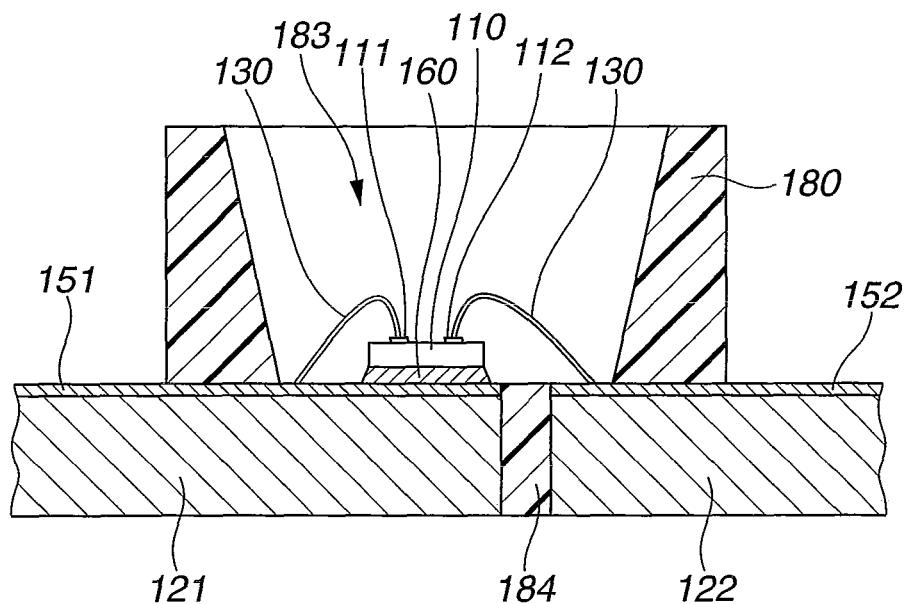
FIG. 6 is a cross sectional view showing the state when the light-emitting element has been mounted in producing the first surface mount light emitting device.

As shown in FIG. 6, the light-emitting element 110 is placed in the recess 183 of the package 180 such that the eutectic layer 160 of the light-emitting element 110 is in contact with the upper surface of the first lead electrode 121. When the entire package 180 is heated to melt the eutectic layer 160 for reflowing and then allowed to stand for cooling, the light-emitting element 110 will be fixedly secured on the surface of the first lead electrode 121.

The electrodes 111 and 112 of the light-emitting element 110 is then electrically connected to the first lead electrode 121 and the second lead electrode 122 by the wire 130.

[7. Encapsulation with the Encapsulating Material 170]

Figure 7:
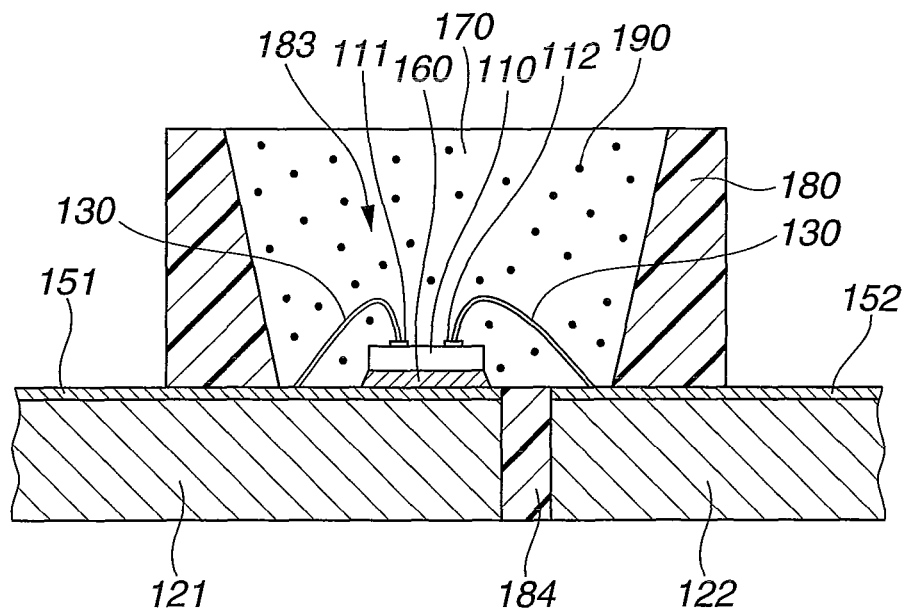
FIG. 7 is a cross sectional view showing the state when the light-emitting element has been encapsulated in producing the first surface mount light emitting device.

After the fixing of the light-emitting element 110, the thermosetting resin for the encapsulation member 170 is encapsulated in the recess 183 as shown in FIG. 7. The encapsulation of the thermosetting resin may be conducted by using a dropper, injector, extruder, and the like, and use of a dropper is preferable in consideration of effectively purging the air remaining in the recess 183 simultaneously with the encapsulation of the thermosetting resin. Preferably, a fluorescent substance 190 is preliminarily mixed with the thermosetting resin to facilitate color tone adjustment of the light emitting device.

After completing the injection, the thermosetting resin is thermally set to thereby form the encapsulation member 170.

Second Surface Mount Light Emitting Device

Figure 8:
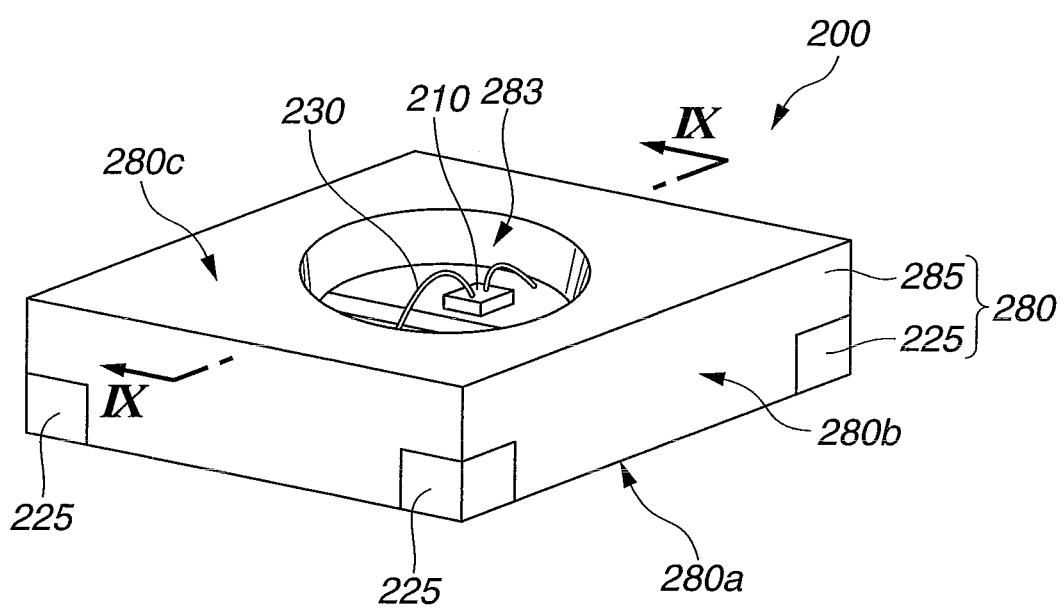
FIG. 8 is a perspective view showing one embodiment of the second surface mount light emitting device.
Figure 9:
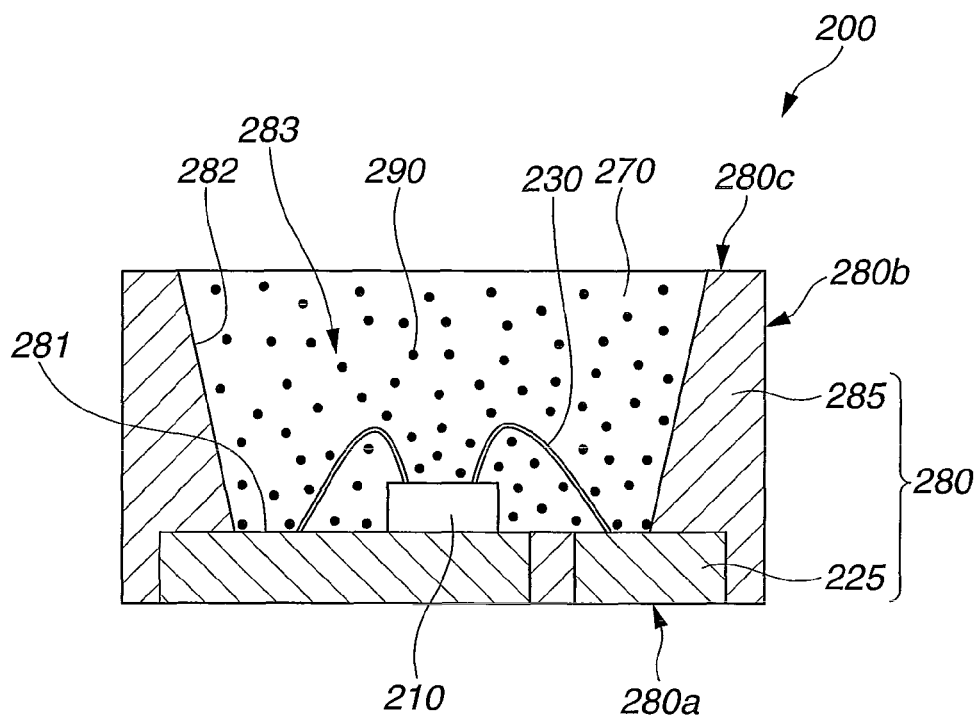
FIG. 9 is a cross sectional view showing of the same device.
Figure 10:
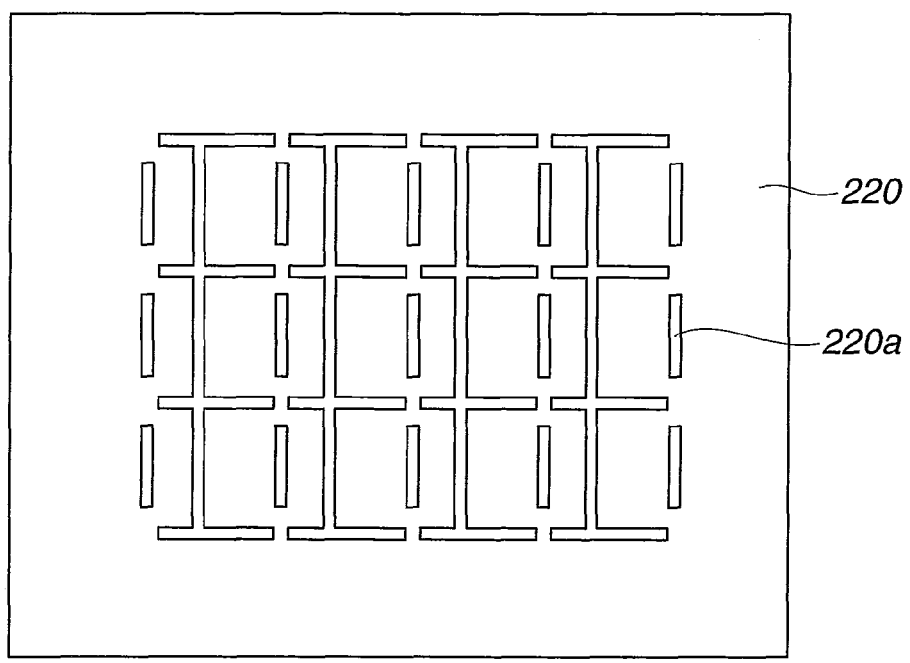
FIG. 10 is a planar view of the lead frame used in the same device.

Next, the second surface mount light emitting device prepared by using the composition of the present invention is described. FIG. 8 is a perspective view of the second surface mount light emitting device, and FIG. 9 is a cross sectional view showing the second surface mount light emitting device taken along lines IX-IX of FIG. 8. FIG. 10 is a planer view showing the lead frame in producing the second surface mount light emitting device.

The second surface mount light emitting device 200 has a package 280 which has a resin portion 285 and another lead 225 on substantially the same plane on the exterior surface 280b. The lead 225 is treated by plating on at least one of its bottom surface (exterior bottom surface 280a of the package 280) and top surface (bottom surface 281 of the recess 283). On the other hand, the side surface of the lead 225 (exterior side surface 280b of the package 280) is not treated by plating. The exterior side surface 280b of the package 280 is largely constituted by the resin portion 285, and the lead 225 is exposed on the corner.

The package 280 is constituted from the resin portion 285 and the lead 225. The resin portion 285 is formed by curing the thermosetting epoxy resin composition of the present invention. The package 280 has the exterior bottom surface 280a where the lead 225 is arranged, the exterior side surface 280b where a part of the lead 225 is exposed, and an exterior top surface 280c where the open recess 283 is formed. The recess 283 has a bottom surface 281 and side surface 282. The lead 225 is exposed on the bottom surface 281 of the recess 283, and the light-emitting element 210 is placed on the lead 225. An encapsulating member 270 is placed in the recess 283 of the package 280 to cover the light-emitting element 210. The encapsulating member 270 contains a fluorescent substance 290. The light-emitting element 210 is electrically connected to the lead 225 by a wire 230. The exterior top surface 280c of the package 280 does not have any lead 225 arranged.

The length of the part where the lead 225 is exposed in the exterior side surface 280b of the package 280 is less than half of the entire peripheral length of the exterior side surface 280b. As will be described below, in producing the light emitting device, slots 220a are provided in the lead frame 220, and the packages are produced by cutting along the slots 220a. Accordingly, the parts where the lead frame 220 has been cut will be the parts where the lead frame 220 is exposed from the package 280.

The lead 225 is exposed on the four corners of the package 280. The lead 225 is exposed on the exterior side surface 280b, and this surface is not treated by plating. The package 280 may have a structure where the lead 225 is also exposed from the exterior bottom surface 280a, and this surface may be plated. It is also possible to treat the exterior side surface 280b of the lead 225 after the cutting.

This package 280 has excellent heat resistance, and this package 280 is less likely to experience deterioration even if the light-emitting element 210 is heated by the electric current.

The shape of the surface mount light emitting device 200 is not particularly limited, and exemplary shapes include those which are substantially rectangular parallelepiped, cube, hexagonal prism, and other polygonal prisms. While recess 283 is preferably tapered toward its bottom, it may be cylindrical. The planer shape of the recess 283 may be, for example, substantially circular, oblong, or polygonal.

Production of the Second Surface Mount Light Emitting Device

Next, the method for producing the second surface mount light emitting device is described. FIG. 11 is a cross sectional view schematically showing the method for producing the second surface mount light emitting device, FIG. 12 is a planer view showing the resin molding.

Figure 11A:
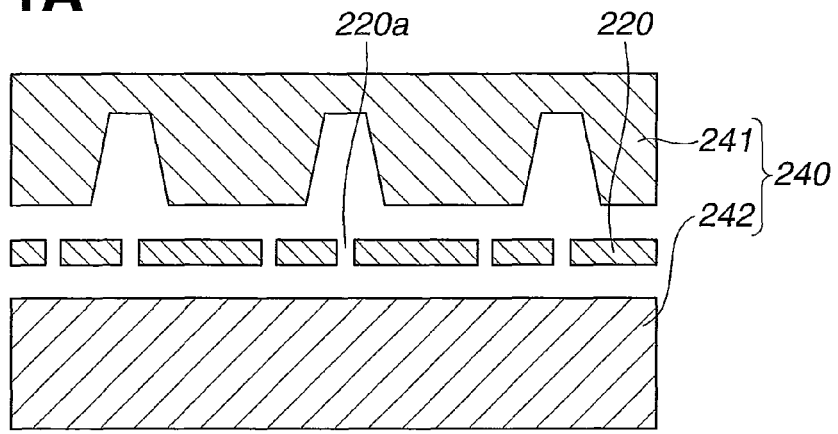
FIG. 11A is a cross sectional view showing the state when the lead frame is placed between the upper and the lower molds.
Figure 11B:
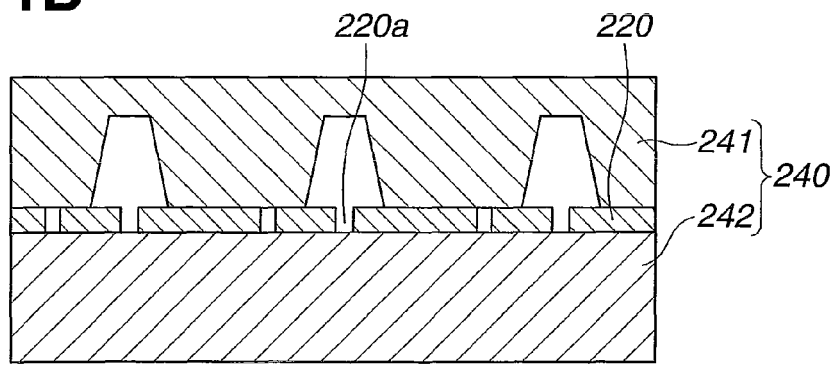
FIG. 11B is a cross sectional view showing the state when the lead frame is sandwiched between the upper and the lower mold.
Figure 11C:
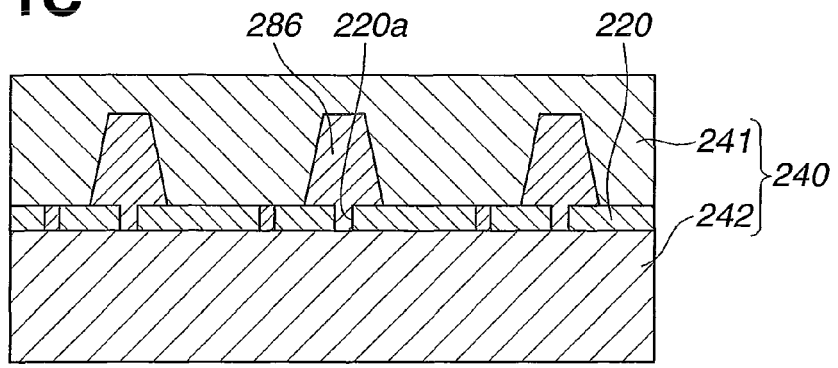
FIG. 11C is a cross sectional view showing the state after the transfer molding.
Figure 11D:
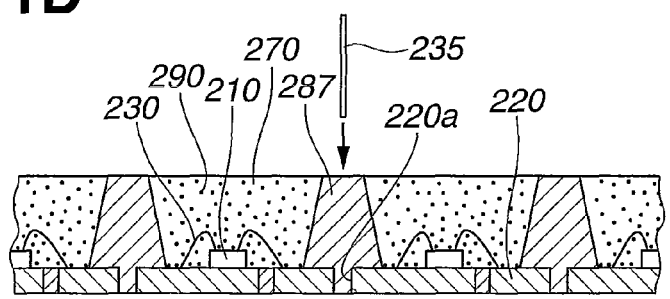
FIG. 11D is a cross sectional view showing the state when the resin molding and the lead frame are to be cut after mounting and encapsulating the light emitting element.
Figure 12:
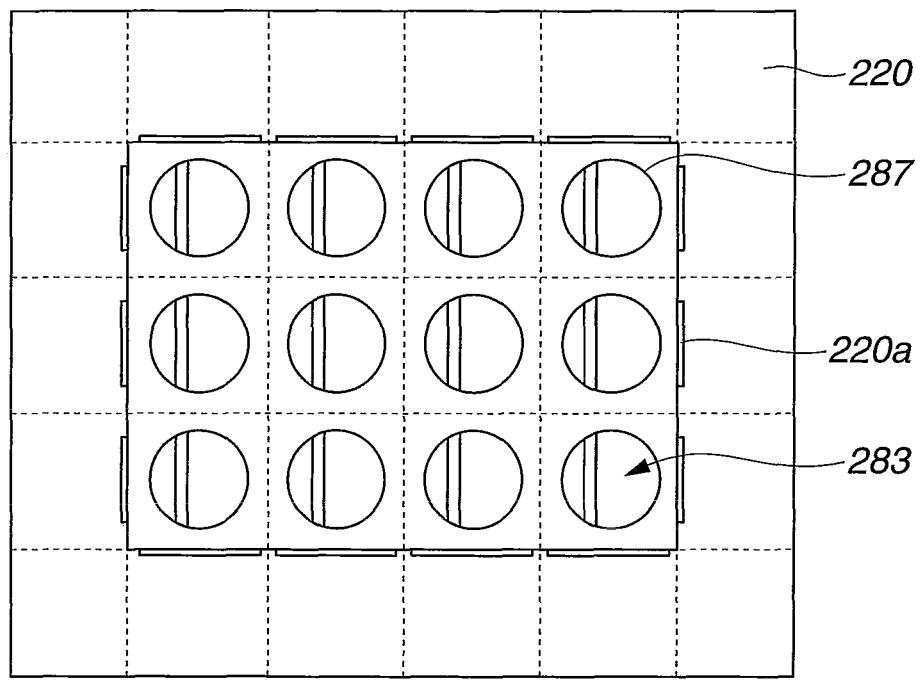
FIG. 12 is a planer view of the resin molding.

The method for producing the second surface mount light emitting device comprises the steps of sandwiching the lead frame 220 formed with the slots 220a between an upper mold 241 and a lower mold 242 [FIGS. 11A and 11B]; the step of injecting the thermosetting resin 286 in the cavity of the mold 240 formed between the upper mold 241 and the lower mold 242 by transfer molding to thereby form a resin molding 287 in the lead frame 220 [FIG. 11C]; and the step of cutting the resin molding 287 and the lead frame 220 along the slot 220a [FIG. 11D].

First, the mold 240 comprising the upper mold 241 and the lower mold 242 used in the transfer molding is described.

The upper mold 241 has plate-shaped main part constituting the upper part of the upper mold, outer wall in the shape of a frame extending from the edge of the main part, a plurality of protrusions protruding from the main part, and injection port extending in horizontal direction through a part of the outer wall.

The outer wall extends vertically from the edge of the main part, and has a first outer wall, a second outer wall, a third outer wall, and a fourth outer wall, respectively forming a first exterior side surface, a second exterior side surface, a third exterior side surface, and a fourth exterior side surface of the resin molding. In other words, the outer wall is the part constituting outer frame of the resin molding, and it has a planer shape of rectangle. The outer wall, however, may have any shape depending on the shape of the resin molding.

The protrusion is the part which becomes in contact with the lead frame 220 in the transfer molding, and an exposed surface where a part of the lead frame 220 is exposed from the resin molding 287 can be reliably formed by preventing intrusion of the thermosetting resin 286 into the contact area. The protrusion protrudes downward from the main part, and this protrusion is formed so that it is surrounded by the outer wall. The part of the protrusion which becomes in contact with the lead frame 220 has flat surface. In order to efficiently arrange the recess on the upper surface plane of the resin molding 287, the protrusions are preferably formed so that they align along a first line at an equal interval, and simultaneously, at each protrusion on the first line, other protrusions are also aligned at an equal interval along the second line which extends at 90° in relation to the first line.

The injection port is formed for the injection of the thermosetting resin 286, and it extends in the horizontal direction through the outer wall at the lower end of the outer wall at substantially central portion. The injection port has a semicircular cross section, and the injection port is formed so that the cross sectional area reduces from the inlet to the outlet.

The upper part of the upper mold 241 is also provided with a pin insertion hole (not shown) extending through the main part of the upper mold so that a pin can be inserted through this hole when the resin molding 287 is to be released from the upper mold 241.

The lower mold 242 is in the form of a plate having a predetermined thickness, and it has a flat surface. The lower mold 242 forms a mold cavity by contacting with the upper mold 241.

Next, each production step is described.

[1. Sandwiching of the Lead Frame 220 by the Molds 241 and 242]

The lead frame 220 is preliminarily formed with the slots 220a, and treated by metal plating.

First, the lead frame 220 formed with the slots 220a is sandwiched between the upper mold 241 and the lower mold 242 so that a mold cavity is formed in the mold 240 by the upper mold 241 and the lower mold 242.

In this process, the lead frame 220 is positioned so that the slot 220a at the position where the recess 283 is formed is sandwiched between the protrusion of the upper mold 241 and the lower mold 242. This prevents flapping of the lead frame 220 at the slot 220a, which contributes for the prevention of the burr formation.

[2. Formation of the Resin Molding 287]

Next, the thermosetting resin 286 is injected in the cavity of the mold 240 formed between the upper mold 241 and the lower mold 242 by transfer molding to thereby form a resin molding 287 in the lead frame 220.

The thermosetting resin 286 is injected by transfer molding from the injection port into the cavity formed in the mold 240 and the mold is heated to the predetermined temperature while applying the predetermined pressure. Since the upper mold 241 and the lower mold 242 sandwiches the lead frame 220 near the slot 220a, flapping of the lead frame 220 during the transfer molding of the thermosetting resin 286 is prevented, and the burr formation at the bottom surface 281 of the recess 283 is prevented.

The pin is inserted in the pin insertion hole to release the resin molding 287 from the upper mold 241. The resin molding is provisionally cured in the mold 240 at a predetermined temperature, and then, released from the mold 240 and cured at a temperature higher than the provisional curing.

[3. Mounting of the Light-Emitting Element 210]

Next, the light-emitting element 210 is mounted on the lead frame 220 at the bottom surface 281 of the recess 283 formed in the resin molding 287, and the light-emitting element 210 is electrically connected to the lead frame 220 by the wire 230. The light-emitting element 210 may be placed on the lead frame 220 after the release of the resin molding 287 from the mold 240, or alternatively, the light-emitting element 210 may be placed on the separated lead frame 220 after cutting the resin molding 287. The light-emitting element may be mounted face down without using the wire. After mounting the light-emitting element 210 on the lead frame 220, the encapsulation material 270 containing the fluorescent substance 290 is encapsulated in the recess 283 followed by the curing of the encapsulation material.

[4. Cutting of the Resin Molding 287 and the Lead Frame 220]

Next, the resin molding 287 and the lead frame 220 are cut along the slot 220a.

The resin molding 287 having the plurality of recesses 283 formed therein is cut both in longitudinal and transverse directions so that each piece is separated at the substantial center of the side wall between the adjacent two recesses by using a dicing saw 135 from the side of the resin molding 287. As a consequence, the resin molding 287 and the lead frame 220 will be arranged in substantially the same plane at the cut surface with the lead frame 220 exposed from the resin molding 287. Provision of the slot 220a results in the decrease of the lead frame 220 that is cut, and this leads to reduced peeling of the lead frame 220 from the resin molding 287. In addition, bond strength between the lead frame 220 and the resin molding 287 is improved since not only the upper surface of the lead frame 220 but also the side surfaces corresponding to the slot 220a are in close contact with the resin molding 287.

EXAMPLES

Next, the present invention is described in further detail by referring to the following Examples and Comparative Examples, which by no means limit the scope of the present invention.

The materials used in the following Examples and Comparative Examples are as shown below.

(A-1) Epoxy Resin

Triazine derivative epoxy resin: tris(2,3-epoxypropyl) isocyanate (product name TEPIC-S manufactured by Nissan Chemical Industries, Ltd.)

(A-2) Acid Anhydride

Acid anhydride having no carbon-carbon double bond: methylhexahydrophthalic anhydride (product name Liqacid MH manufactured by Shin-Nihon Rika)

(B) Internal Mold Release Agent
  (B-1) Glycerin monostearate (product name H-100 manufactured by Riken Vitamin)
  (B-2) Propylene glycol monobehenate (product name PB-100 manufactured by Riken Vitamin)
  (B-3) Stearyl stearate (product name SL-900A manufactured by Riken Vitamin)
  (B-4) Polyethylene wax (product name PE-190 manufactured by Clariant (Japan))
  (B-5) Polyethylene oxide wax (product name H-22 manufactured by Clariant (Japan))
  (B-6) Acid wax: stearic acid (product name manufactured by Wako Pure Chemical)

(C) Reflective Material
  (C-1) Titanium dioxide: rutile structure (product name CR-95 manufactured by Ishihara Sangyo Kaisha, Ltd.)
  (C-2) Titanium dioxide: rutile structure (product name R-45M manufactured by Sakai Chemical Industry Co., Ltd.
  (C-3) Titanium dioxide: rutile structure (product name R-820 manufactured by Ishihara Sangyo Kaisha, Ltd.)

(D) Inorganic Filler: Pulverized Fused Silica
  (product name, manufactured by Tatsumori (E) Curing Catalyst
  (E-1) Phosphorus curing catalyst: quaternary phosphonium bromide (product name U-CAT5003 manufactured by San-Apro Limited)
  (E-2) Amine curing catalyst: Special amine (product name U-CAT18X manufactured by San-Apro Limited)

(E-3) Phosphorus curing catalyst: quaternary phosphonium borate (product name PX-4PB manufactured by Nippon Chemical Industrial Co., Ltd.)

(F) Reinforcing Material (F-1) Wollastonite (product name KGP-H65 manufactured by KANSAI MATEC CO., LTD.)

<Production of Surface Mount Light Emitting Device>

The light emitting device of the present invention was produced by the production method as described above by referring to FIGS. 3 to 7.

As shown in Table 1, each internal mold release agent was evaluated for the following properties. The results are also shown in Table 1.

[Resistance to Yellowing by Heat]

For each internal mold release agent, 10 g of the internal mold release agent was placed in an aluminum dish, and allowed to stand at 180° C. for 24 hours to compare the yellowing between the internal mold release agents.

TABLE 1

| | Internal mold release agent | | Melting point (° C.) | Appearance | Resistance to yellowing by heat (180° C., 24 hr) |
|---|---|---|---|---|---|
| B-1 | Glycerine monostearate | H-100 | 68 | White | Transparent |
| B-2 | Propylene glycol monobehenate | PB-100 | 56 | White | Transparent |
| B-3 | Stearyl stearate | SL-900A | 55 | White | Transparent |
| B-4 | Polyethylene wax | PE-190 | 135 | White | Pale yellow |
| B-5 | Polyethylene oxide wax | H-22 | 105 | White | Pale yellow |
| B-6 | Acid wax | Stearic acid | 70 | White | Pale yellow |

Examples 1 to 3 and Comparative Examples 1 to 6

Based on the results shown in Table 1, (B-1) to (B-3) exhibiting acceptable resistance to yellowing by heat were selected for the internal mold release agent.

The epoxy resin, the acid anhydride, and the antioxidant were placed in a reaction vessel, and heated to 100° C. The molten mixture was stirred for 3 hours, cooled for solidification (the solidified mixture had a softening point of 60° C.), crushed, blended with other components at the predetermined blend ratio, homogeneously mixed by using two thermal rolls, cooled, and crushed to obtain the white epoxy resin composition shown in Table 2.

These compositions were evaluated for the following properties. The results are shown in Table 2.

[Lighting Test]

The light emitting device of Examples and Comparative Example was evaluated for their initial properties and power stability by conducting a long term lighting test. The lighting test was conducted by supplying a current of 500 mA to the light emitting device at a test temperature of 25° C. for 1,000 hours, 350 mA at 100° C. for 1,000 hours, and 600 mA at a temperature of 60° C. and a relative humidity of 90% for 1,000 hours. After the lighting for 1,000 hours, optical power of the light emitting device was measured by using an integrating sphere.

[Spiral Flow Value]

Spiral flow value was measured by using an EMMI mold at 175° C., 6.9 N/mm$^2$, and a molding time of 120 seconds.

[Melt Viscosity]

The melt viscosity was measured by using Kouka flow tester at a pressure of 10 kgf using a nozzle having a diameter of 1 mm at a temperature of 175° C.

[Flexural Strength]

Flexural strength was measured at room temperature by forming a cured product in a mold according to EMMI at 175° C., 6.9 N/mm$^2$, and a molding time of 120 seconds.

[Continuous Moldability]

A mold having 6 cavities per frame having a package design for 100P-QFP (14 mm×20 mm×2.7 mm) was mounted in a continuous molding machine. After cleaning the mold with melamine resin and a mold release recovery agent, continuous molding was conducted at a molding cycle of 180° C. for 60 seconds. The molding operation was continued until the operation was interrupted by mold release obstruction such as gate or runner breakage or a short shot. The number of shots was counted with the upper limit of 300 shots.

[Light Reflectivity]

A disk (cured product) having a diameter of 50 mm and a thickness of 3 mm was molded at 175° C., 6.9 N/mm$^2$, and a molding time of 180 seconds, and immediately after the molding, the disk was stored at 180° C. for 24 hours and irradiated with UV for 24 hours (a high pressure mercury lamp 60 mW/cm having the peak wavelength at 365 nm). After the irradiation, the light reflectivity at a wavelength of 450 nm was measured by using X-rite 8200 manufactured by SDG.

[Reflow Resistance]

Reflow resistance was measured by molding a disk having a diameter of 50 mm and a thickness of 3 mm at 175° C., 6.9 N/mm$^2$, and a molding time of 2 minutes, and allowing the disk to stand at 300° C. for 1 hour, and comparing the appearance.

TABLE 2

| Composition (parts by weight) | | | | Example | | | Comparative Example | | | | | |
|---|---|---|---|---|---|---|---|---|---|---|---|---|
| | | | | 1 | 2 | 3 | 1 | 2 | 3 | 4 | 5 | 6 |
| (A) | Epoxy resin | (A-1) | TEPIC-S | 9 | 9 | 9 | 9 | 9 | 9 | 9 | 9 | 9 |
| | Acid anhydride | (A-2) | Liqacid MH | 14 | 14 | 14 | 14 | 14 | 14 | 14 | 14 | 14 |

TABLE 2-continued

|  |  |  |  | Example | | | Comparative Example | | | | | |
|---|---|---|---|---|---|---|---|---|---|---|---|---|
| Composition (parts by weight) | | | | 1 | 2 | 3 | 1 | 2 | 3 | 4 | 5 | 6 |
| Reaction between (A-1) and (A-2) | | | | Yes | Yes | Yes | Yes | Yes | Yes | Yes | Yes | Yes |
| (B) | Internal mold release agent | (B-1) | H-100 | 1 |  | 0.5 | 1 |  |  |  |  |  |
|  |  | (B-2) | PB-100 |  | 1 | 0.5 |  |  | 1 |  |  |  |
|  |  | (B-3) | SL-900A | 1 | 1 | 1 |  | 1 |  |  |  |  |
|  |  | (B-4) | PE-190 |  |  |  | 1 |  |  |  |  |  |
|  |  | (B-5) | HS-22 |  |  |  |  | 1 |  |  |  |  |
|  |  | (B-6) | Stearic acid |  |  |  |  |  | 1 | 2 | 2 | 2 |
| (C) | Reflective material | (C-1) | CR-95 | 30 | 30 | 30 | 30 | 30 | 30 |  |  |  |
|  |  | (C-2) | R-45M |  |  |  |  |  |  | 30 |  |  |
|  |  | (C-3) | R-820 |  |  |  |  |  |  |  | 30 |  |
| (D) | Inorganic filler | | | 30 | 30 | 30 | 30 | 30 | 30 | 30 | 30 | 30 |
| (E) | Curing catalyst | (E-1) | U-CAT5003 | 1 | 1 | 1 | 2 | 2 | 2 | 2 | 2 |  |
|  |  | (E-2) | U-CAT18X | 1 | 1 | 1 |  |  |  |  |  |  |
|  |  | (E-3) | PX-4PB |  |  |  |  |  |  |  |  | 2 |
| (Other component) | Antioxidant | Triphenyl phosphite | | 0.1 | 0.1 | 0.1 | 0.1 | 0.1 | 0.1 | 0.1 | 0.1 | 0.1 |
| Measurements | Spiral flow (inch) | | | 47 | 50 | 46 | 18 | 19 | 18 | 17 | 19 | 56 |
|  | Melt Viscosity (Pa · s) | | | 10 | 9 | 10 | 50 | 45 | 49 | 47 | 48 | 10 |
|  | Flexural strength at room temperature (N/mm$^2$) | | | 90 | 88 | 90 | 90 | 85 | 88 | 85 | 80 | 75 |
|  | Continuous moldability (number of shots) | | | 300< | 300< | 300< | 60 | 83 | 92 | 90 | 103 | 105 |
|  | Light reflectivity | Initial | | 90 | 90 | 89 | 89 | 89 | 88 | 87 | 87 | 90 |
|  |  | After storing 24 hrs. at 180° C. | | 89 | 89 | 89 | 89 | 83 | 81 | 79 | 77 | 85 |
|  |  | After UV irradiation for 24 hrs. | | 90 | 90 | 89 | 89 | 88 | 87 | 87 | 87 | 88 |
|  | Reflow resistance | | | Good | Good | Good | Good | Good | Good | Good | Good | Foamed |

Lead content of the Example 1 and the Comparative Example 4 was also measured to be 0 ppm and 25 ppm, respectively.

Examples 4 to 6 and Comparative Examples 7 to 10

The epoxy resin, the acid anhydride, and the antioxidant were placed in a reaction vessel, and heated to 100° C. The molten mixture was stirred for 3 hours, cooled for solidification (the solidified mixture had a softening point of 60° C.), crushed, blended with other components at the predetermined blend ratio, homogeneously mixed by using two thermal rolls, cooled, and crushed to obtain the white epoxy resin composition shown in Table 3.

These compositions were evaluated for the following properties. The results are shown in Table 3.

[Spiral Flow Value]

Spiral flow value was measured by using an EMMI mold at 175° C., 6.9 N/mm$^2$, and a molding time of 120 seconds.

[Flexural Strength]

Flexural strength was measured at room temperature and 260° C. by forming a cured product in a mold according to EMMI at 175° C., 6.9 N/mm$^2$, and a molding time of 120 seconds.

[Light Reflectivity]

A disk (cured product) having a diameter of 50 mm and a thickness of 3 mm was molded at 175° C., 6.9 N/mm$^2$, and a molding time of 180 seconds, and immediately after the molding, the disk was stored at 180° C. for 24 hours and irradiated with UV for 24 hours (a high pressure mercury lamp 60 mW/cm having the peak wavelength at 365 nm). After the irradiation, the light reflectivity at a wavelength of 450 nm was measured by using X-rite 8200 manufactured by SDG.

[Presence of Voids]

A QFP package (28 mm×28 mm×1.4 mm) was molded for 12 cycles at a molding cycle of 175° C. and 6.9 N/mm$^2$ for 180 seconds. The molded articles were evaluated for the presence of internal voids by soft X-ray. The results were evaluated "Yes" when an internal void of 500 μm or larger was observed, and "No" when such internal void was not observed.

TABLE 3

|  |  |  |  | Example | | | Comparative Example | | | |
|---|---|---|---|---|---|---|---|---|---|---|
| Composition (parts by weight) | | | | 4 | 5 | 6 | 7 | 8 | 9 | 10 |
| (A) | Epoxy resin | (A-1) | TEPIC-S | 9 | 9 | 9 | 9 | 9 | 9 | 9 |
|  | Acid anhydride | (A-2) | Liqacid MH | 14 | 14 | 14 | 14 | 14 | 14 | 14 |
| Reaction between (A-1) and (A-2) | | | | Yes | Yes | Yes | Yes | Yes | Yes | Yes |
| (B) | Internal mold release agent | (B-1) | H-100 | 1 | 1 | 1 | 1 | 1 | 1 | 1 |
|  |  | (B-2) | PB-100 | 5 | 5 | 5 | 5 | 5 | 5 | 5 |
| (C) | Reflective material | (C-1) | CR-95 | 30 | 30 | 30 | 30 | 30 | 30 | 15 |
| (D) | Inorganic filler | | | 30 | 30 | 30 | 30 | 30 | 30 |  |
| (E) | Curing catalyst | (E-2) | U-CAT18X | 1 | 1 | 1 | 1 | 1 | 1 | 1 |
| (F) | Reinforcing material | (F-1) | KGP-H65 | 2 | 6 | 10 |  | 1 | 1.5 | 1 |

TABLE 3-continued

| Composition (parts by weight) | | Example | | | Comparative Example | | | |
|---|---|---|---|---|---|---|---|---|
| | | 4 | 5 | 6 | 7 | 8 | 9 | 10 |
| Measurements | Spiral flow (inch) | 47 | 50 | 46 | 47 | 19 | 18 | 4 |
| | Flexural strength at room temperature (N/mm$^2$) | 95 | 100 | 100 | 78 | 79 | 78 | 30 |
| | Flexural strength at 260° C. (N/mm$^2$) | 6.2 | 6.8 | 8.3 | 4.8 | 4.5 | 4.6 | 2.1 |
| Light reflectivity | Initial | 90 | 90 | 89 | 89 | 89 | 88 | 81 |
| | After storing 24 hrs. at 180° C. | 89 | 89 | 89 | 89 | 83 | 81 | 74 |
| | After UV irradiation for 24 hrs. | 90 | 90 | 89 | 89 | 88 | 87 | 79 |
| | Presence of voids | No | No | No | No | No | No | Yes |

[Lighting Test]

The light emitting device of Examples 1 to 6 and Comparative Examples 1 to 6 was evaluated for their initial properties and power stability by conducting a long term lighting test. The lighting test was conducted by supplying a current of 500 mA to the light emitting device at a test temperature of 25° C. for 1,000 hours, 350 mA at 100° C. for 1,000 hours, and 600 mA at a temperature of 60° C. and a relative humidity of 90% for 1,000 hours. After the lighting for 1,000 hours, optical power of the light emitting device was measured by using an integrating sphere.

[Productivity of the Light Emitting Device]

Number of shots in the continuous molding in Examples 1 to 6 and Comparative Examples 1 to 6 was evaluated by the following criteria:

A (excellent): 100 shots or higher

B (fair): at least 25 shots and less than 100 shot

C (poor): 0 shot to less than 25 shots

The results are shown in Table 4.

Decrease in the optical power after lighting at 100° C. and 350 mA for 1000 hours was smaller in Example 1 compared to Comparative Example 1. No substantial decrease in the optical power after lighting at 60° C. and relative humidity of 90% at 600 mA for 1,000 hours was observed in Example 1 while the decrease was significant in Comparative Example 1.

Decrease in the optical power under each set of conditions was smaller in Examples 2 to 6 compared to Comparative Examples 2 to 6, respectively.

Continuous productivity was excellent in Examples while it was poor in Comparative Examples.

TABLE 4

| | Example | | | | | | Comparative Example | | | | | |
|---|---|---|---|---|---|---|---|---|---|---|---|---|
| | 1 | 2 | 3 | 4 | 5 | 6 | 1 | 2 | 3 | 4 | 5 | 6 |
| Initial power | 103% | 103% | 103% | 103% | 103% | 103% | 103% | 103% | 103% | 100% | 100% | 103% |
| Lighting at 25° C. and 500 mA for 1000 hrs. | 105% | 105% | 105% | 105% | 105% | 105% | 105% | 102% | 100% | 98% | 96% | 104% |
| Lighting at 100° C. and 350 mA for 1000 hrs. | 99% | 99% | 99% | 99% | 99% | 99% | 96% | 93% | 91% | 89% | 87% | 95% |
| Lighting at 60° C., 90% RH, and 600 mA for 1000 hrs. | 103% | 103% | 103% | 103% | 103% | 103% | 100% | 97% | 95% | 93% | 91% | 99% |
| Productivity of the light emitting device | A | A | A | A | A | A | C | B | B | B | B | B |

Japanese Patent Application No. 2008-318429 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A thermosetting epoxy resin composition comprising
   (A) a reaction mixture of a triazine derivative epoxy resin and an acid anhydride at a ratio of the epoxy group equivalent to the acid anhydride equivalent of 0.6 to 2.0;
   (B) an internal mold release agent;
   (C) a reflective material;
   (D) an inorganic filler; and
   (E) a curing catalyst;
wherein the internal mold release agent of component (B) comprises in combination:
   a carboxylate ester represented by the following general formula (1):

$$R^{11}\text{—COO—}R^{12} \quad (1)$$

wherein
R$^{11}$ and R$^{12}$ are independently an alkyl group represented by C$_n$H$_{2n+1}$, and
for R$^{11}$ n is a number of 2 to 28, and
for R$^{12}$ n is a number of 5 to 25, and
a compound represented by the following general formula (2):

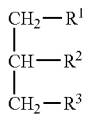

(2)

wherein R$^1$, R$^2$, and R$^3$ are independently selected from H, —OH, —OR, and —O(C=O)C$_a$H$_b$, with the proviso that at least one of the R$^1$, R$^2$, and R$^3$ includes —O(C=O)C$_a$H$_b$; R is an alkyl group represented by C$_p$H$_{2p+1}$,
wherein p is an integer of 1 to 30, a is an integer of 10 to 30, and b is an integer of 17 to 61, and
wherein the weight ratio, in the internal mold release agent of component (B), of the carboxylate ester of the formula (1) to the compound of the formula (2) is in the range of 1:5 to 3:4, and
the compound of the formula (2) constitutes at least 50% by weight of the entire internal mold release agent of component (B), and
the internal mold release agent of component (B) has a melting point in the range of 50 to 90° C., and
the internal mold release agent of component (B) has a volatile content at 250° C. of up to 10% by weight, and
wherein an amount of the reflective material of component (C) is from 5 to 80% by weight of the entire composition.

2. A thermosetting epoxy resin composition according to claim 1 wherein the total content of the carboxylate ester of formula (1) and the compound of the formula (2) in the entire composition is 0.2 to 5.0% by weight.

3. A thermosetting epoxy resin composition according to claim 1 wherein the reflective material of component (C) is titanium dioxide which has its surface treated with an inorganic or organic substance; lead content in component (C) is up to 10 ppm; the curing catalyst of component (E) is an octylate of a tertiary amine; and the content of component (E) is 0.05 to 5% by weight in relation to the entire composition.

4. A thermosetting epoxy resin composition according to claim 1 wherein the triazine derivative epoxy resin is 1,3,5-triazine derivative epoxy resin.

5. A thermosetting epoxy resin composition according to claim 4 wherein the reaction mixture of the component (A) contains a compound represented by the following general formula (3):

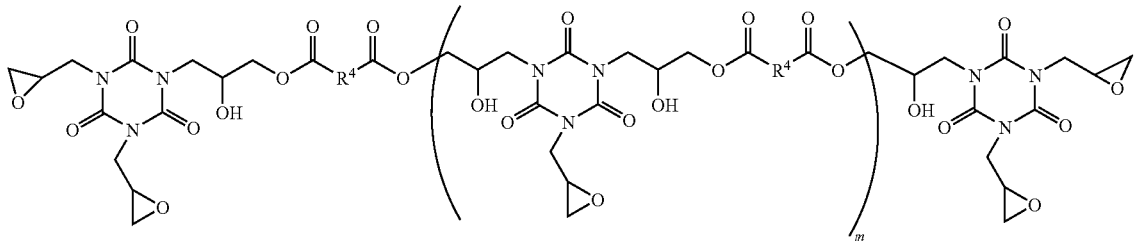

(3)

wherein R$^4$ represents an acid anhydride residue, and m is a number of 0 to 200.

6. A semiconductor element case comprising a cured product of the thermosetting epoxy resin composition according to claim 1.

7. A semiconductor device comprising a semiconductor element encapsulated by a cured product of the thermosetting epoxy resin composition according to claim 1.

8. A thermosetting epoxy resin composition according to claim 1, wherein the compound of formula (2) in the internal mold release agent of component (B) comprises glycerin monostearate having a melting point of 50 to 70° C. and the content of the internal mold release agent is 0.2 to 5.0% by weight in the entire composition.

9. A thermosetting epoxy resin composition according to claim 1, wherein a reinforcing material (F) is added.

10. A thermosetting epoxy resin composition according to claim 9, wherein the component (F) is a triclinic silicate mineral represented by the chemical formula: CaSiO$_3$.

11. A thermosetting epoxy resin composition according to claim 9, wherein the content of the reinforcing material of component (F) is 1 to 80% by weight in the entire composition.

12. A package comprising the thermosetting epoxy resin composition according to claim 1 and a recess for placing a light-emitting element in the recess.

13. A thermosetting epoxy resin composition according to claim 1, wherein for R$^{11}$ n is a number of 5 to 25.

14. A thermosetting epoxy resin composition according to claim 1, wherein n=18 for R$^{11}$ or R$^{12}$ of general formula (1).

15. A thermosetting epoxy resin composition according to claim 1, wherein the internal mold release agent of component (B) has a melting point in the range of 65 to 85° C.

* * * * *